(12) United States Patent
Yamaguchi et al.

(10) Patent No.: US 11,764,780 B2
(45) Date of Patent: Sep. 19, 2023

(54) SUPERCONDUCTING CIRCUIT

(71) Applicant: NEC Corporation, Tokyo (JP)

(72) Inventors: Aiko Yamaguchi, Tokyo (JP); Yuichi Igarashi, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 17/960,213

(22) Filed: Oct. 5, 2022

(65) Prior Publication Data
US 2023/0127101 A1     Apr. 27, 2023

(30) Foreign Application Priority Data
Oct. 25, 2021   (JP) .................... 2021-174033

(51) Int. Cl.
*H03K 17/92*   (2006.01)
*H03K 5/1252*   (2006.01)

(52) U.S. Cl.
CPC .......... *H03K 17/92* (2013.01); *H03K 5/1252* (2013.01)

(58) Field of Classification Search
CPC ...................................... H03K 17/92
USPC ........................................ 327/527
See application file for complete search history.

(56) References Cited

U.S. PATENT DOCUMENTS 10,235,634 B1 * 3/2019 Chen .................. G06N 20/00

FOREIGN PATENT DOCUMENTS

JP     2019-041088     3/2019

* cited by examiner

*Primary Examiner* — Tomi Skibinski
(74) *Attorney, Agent, or Firm* — Sughrue Mion, PLLC

(57) ABSTRACT

In an aspect, the present disclosure provides a superconducting circuit including: a ground plane including a superconducting member; a plurality of superconducting parts surrounded by a non-conductive part with space from the ground plane, each of the plurality of superconducting parts including four coupling ports each configured to enable the superconducting part to interact with another superconducting part; a superconducting quantum interference device configured to set a resonance frequency of a first superconducting part included in the plurality of superconducting parts; and a multilevel wiring line configured to form, in cooperation with the ground plane, a superconducting loop surrounding the superconducting quantum interference device, in which the superconducting quantum interference device is disposed, in an area inside the superconducting loop, at a place where a magnetic field generated by a current from a bias line for the first superconducting part is applied.

14 Claims, 39 Drawing Sheets

SUPERCONDUCTING CIRCUIT

INCORPORATION BY REFERENCE

This application is based upon and claims the benefit of priority from Japanese patent application No. 2021-174033, filed on Oct. 25, 2021, the disclosure of which is incorporated herein in its entirety by reference.

TECHNICAL FIELD

The present disclosure relates to a superconducting circuit.

BACKGROUND ART

The inductance of a superconducting quantum interference device (SQUID: Superconducting QUantum Interference Device) can be changed by applying a magnetic field to the SQUID. Therefore, one use of the SQUID, among its various uses, is to change the resonance frequency of a superconducting qubit (a resonator).

In the case where there is a plurality of SQUIDs in a circuit, when a magnetic field is applied to one of the SQUIDs, a magnetic field is also generated in another SQUID(s), so that, in some cases, the resonance frequency of the qubit(s) controlled by the other SQUID(s) is changed. This phenomenon is called crosstalk. Crosstalk is a problem-causing phenomenon that occurs when a plurality of SQUIDs is controlled independently of each other.

Japanese Unexamined Patent Application Publication No. 2019-041088 discloses that crosstalk is reduced by providing a ground pad for guiding a return current away from a qubit coupler SQUID.

SUMMARY

An object of the present disclosure is to provide a superconducting circuit capable of reducing crosstalk.

In a first aspect of the present disclosure, a superconducting circuit includes: a ground plane including a superconducting member; a plurality of superconducting parts surrounded by a non-conductive part so as to be spaced from the ground plane, each of the plurality of superconducting parts including four coupling ports each configured to enable the superconducting part to interact with another superconducting part; a superconducting quantum interference device configured to set a resonance frequency of a first superconducting part included in the plurality of superconducting parts; and a multilevel wiring line configured to form, in cooperation with the ground plane, a superconducting loop surrounding the superconducting quantum interference device, in which the superconducting quantum interference device is disposed, in an area inside the superconducting loop, at a place where a magnetic field generated by a current from a bias line for the first superconducting part is applied.

BRIEF DESCRIPTION OF DRAWINGS

The above and other aspects, features and advantages of the present disclosure will become more apparent from the following description of certain example embodiments when taken in conjunction with the accompanying drawings, in which.

EXAMPLE EMBODIMENT

The principle of the present disclosure will be described with reference to several illustrative example embodiments. It should be understood that these example embodiments are described only for an illustrative purpose and will assist those skilled in the art in understanding and carrying out the present disclosure without suggesting any limitations in regard to the scope of the disclosure. Disclosures described in this specification can also be implemented in a variety of ways other than those described below.

In the following description and the claims, unless otherwise defined, all technical and scientific terms used in this specification have the same meanings as those generally understood by those skilled in the technical field to which the present disclosure belongs.

An example embodiment according to the present disclosure will be described hereinafter with reference to the drawings.

First Example Embodiment

<Configuration>

Figure 1:
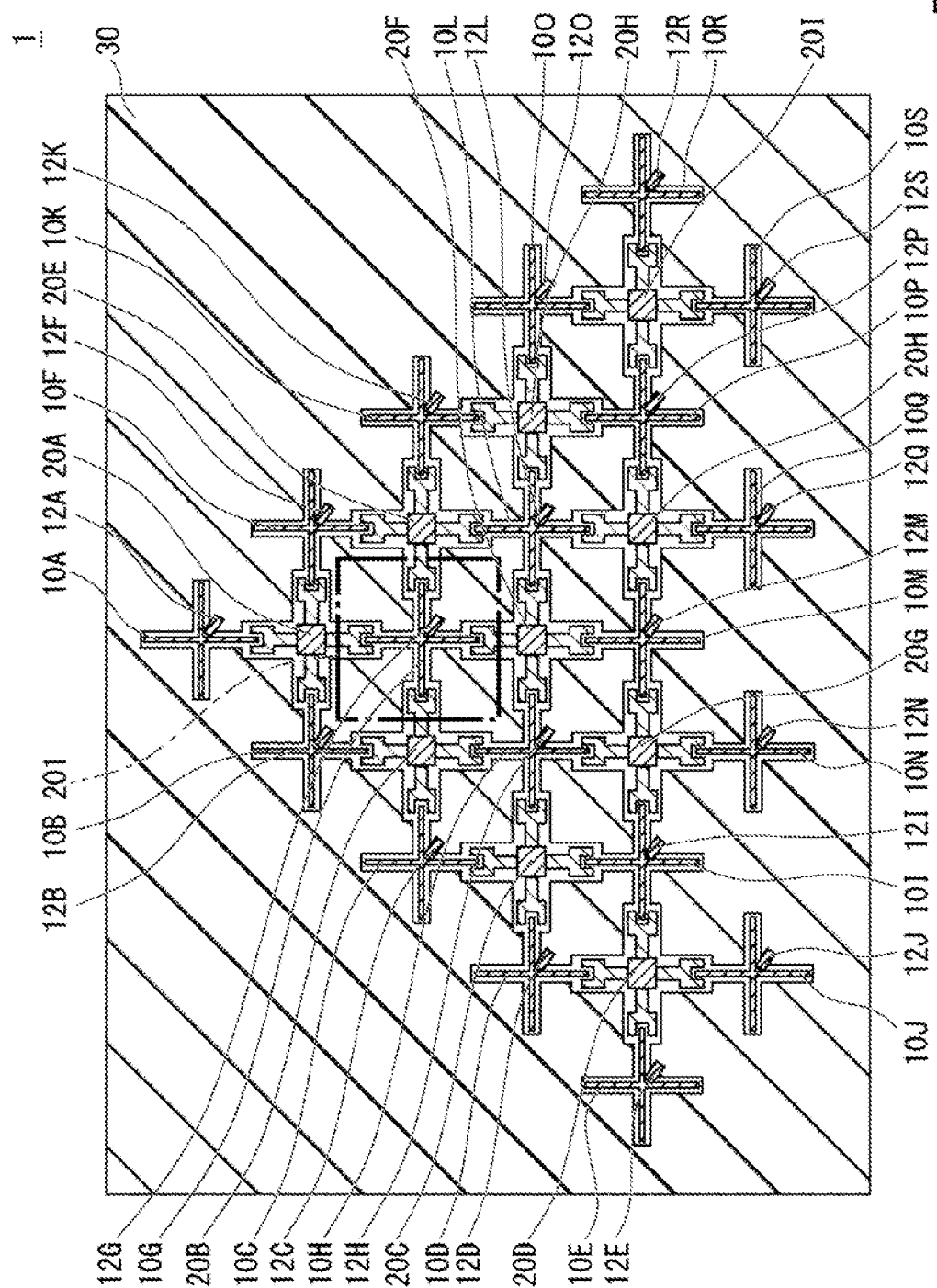
FIG. 1 shows an example of a configuration of each qubit or the like in a superconducting circuit 1 according to a first example embodiment.

An example of a configuration of a superconducting circuit 1 according to a first example embodiment will be described with reference to FIGS. 1 to 4. FIG. 1 shows an example of a configuration of each qubit or the like in the superconducting circuit 1 according to the first example embodiment. The superconducting circuit 1 according to the present disclosure may be used, for example, in a quantum annealing machine which is a computer for solving a combination optimization problem.

In the example shown in FIG. 1, the superconducting circuit 1 includes qubits 10A, 10B, 10C, 10D, 10E, 10F, 10G, 10H, 10I, 10J, 10K, 10L, 10M, 10N, 10O, 10P, 10Q, 10R and 10S (in the following description, when the qubits do not need to be distinguished from each other, they are simply referred to as the "qubit(s) 10") each of which is implemented by a resonator or the like. Note that the qubit 10 is an example of a "superconducting part". Further, the superconducting circuit 1 include couplers 20A, 20B, 20C, 20D, 20E, 20F, 20G, 20H, 20I and 20J (in the following description, when the couplers do not need to be distinguished from each other, they are simply referred to as the "coupler(s) 20"). Further, the superconducting circuit 1 includes a ground plane 30 and a non-conductive part 40. The ground plane 30 may be formed, for example, by laminating a superconducting member on the substrate of the superconducting circuit 1. The non-conductive part 40 is an area where no electricity is conducted. The non-conductive part 40 may be formed, for example, by stripping (removing) the conductive material of the ground plane 30 from the substrate of the superconducting circuit 1.

Each qubit 10 has four coupling ports which enable the qubit 10 to interact with four other qubits 10 adjacent to the qubit 10, and is capacitively coupled to couplers 20 by these coupling ports. Note that each qubit 10 may be, for example, a superconducting member that is spaced from the ground plane 30 by the non-conductive part 40 and surrounded by the non-conductive part 40. Note that a part of the superconducting member laminated on the substrate of the superconducting circuit 1 that is surrounded by the non-conductive part 40 may be formed as the qubit 10, and a part of the superconducting member other than the non-conductive part 40 and the qubit 10 may be formed as the ground plane 30.

Figure 2:
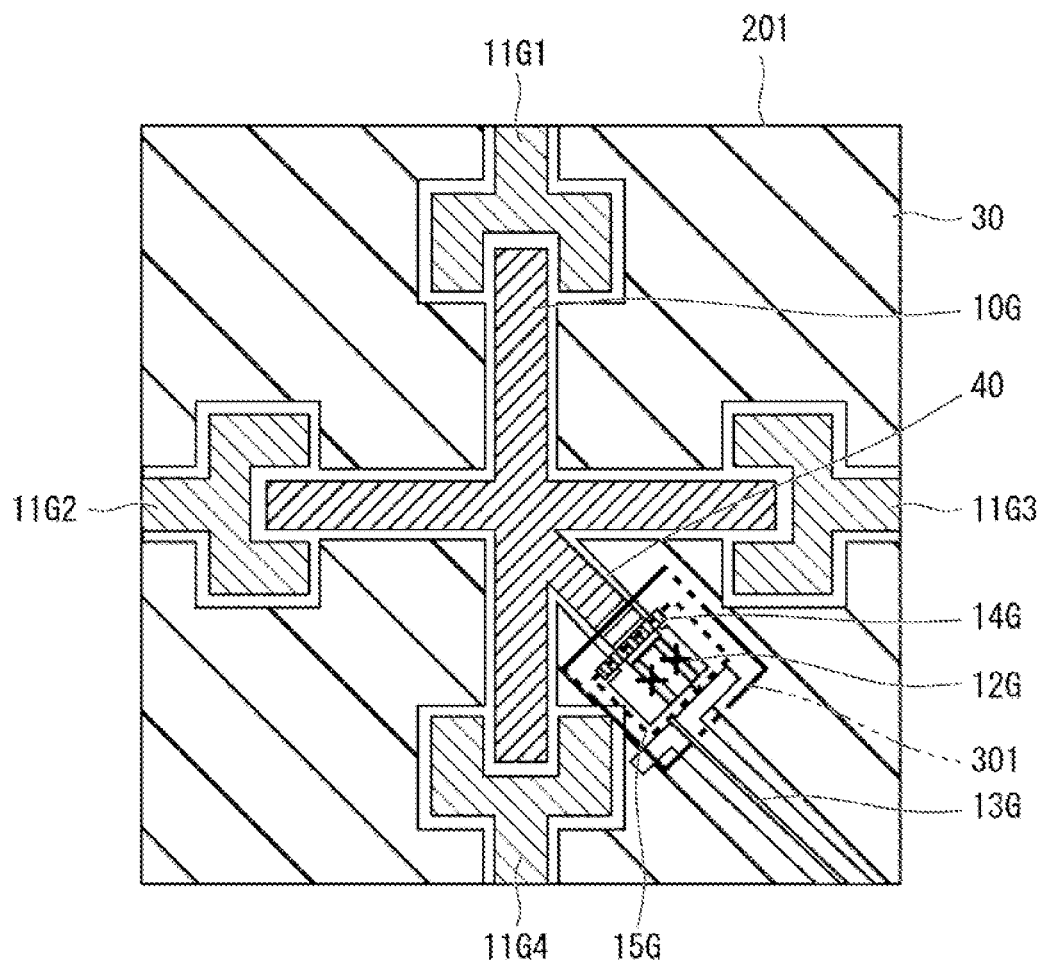
FIG. 2 shows an example of a configuration around a qubit 10G in the superconducting circuit 1 according to the first example embodiment.

FIG. 2 shows an example of a configuration around the qubit 10G in the superconducting circuit 1 according to the first example embodiment. FIG. 2 shows an example of an area 201 around the qubit 10G shown in FIG. 1. As shown in FIG. 2, for example, the qubit 10G is connected to the coupler 20A by a coupling port 11G1, connected to the coupler 20B by a coupling port 11G2, connected to the coupler 20E by a coupling port 11G3, and connected to the coupler 20F by a coupling port 11G4.

Note that, in adiabatic quantum computing such as quantum annealing, when a two-body interaction between every pair of all the qubits in the circuit is realized, the fact that the system adiabatically evolves over time and reaches the lowest energy state corresponds to solving an Ising model. However, in practice, it is difficult to make two qubits that are far apart from each other interact with each other. In an example embodiment according to the present disclosure, qubits 10 adjacent to each other are coupled with each other by an interaction (e.g., by a four-body interaction), so that the fully coupled qubits are indirectly realized in an approximate manner. Therefore, each qubit 10 includes 4 coupling ports. Note that the above-described method is called a LHZ (Lechner, Hauke, Zoller) method or the like.

The qubits 10A to 10S are electrically connected to the SQUID 12A to 12S (in the following description, when the qubits do not need to be distinguished from each other, they are simply referred to as the "SQUID(s) 12"), respectively. Note that the SQUID (Superconducting QUantum Interference Device) may be, for example, a device that is obtained by connecting two Josephson junctions through superconducting lines so that they form a loop. The qubit 10 may include, for example, a lumped constant type resonator such as a Josephson parametric oscillator (JPO: Josephson Parametric Oscillator). In this case, the qubit 10 starts self-oscillating when a microwave having a frequency about two times the resonance frequency of the qubit 10 and an amplitude exceeding a threshold value is applied to the SQUID 12. Note that the JPO has two oscillation states having different phases, and these two states can be used as 0 and 1, respectively, of the qubit. Each of the SQUIDs 12A to 12S sets the resonance frequency of the respective one of the qubits 10A to 10S when a magnetic field is applied thereto by a bias current supplied from a bias line.

The superconducting circuit 1 according to the present disclosure includes a multilevel wiring line (i.e., a three-dimensional wiring line or a vertical wiring line) which is disposed at a place where the multilevel wiring line forms, in cooperation with the ground plane 30, a superconducting loop surrounding a respective SQUID 12 and includes at least one of an air bridge and an interposer. Note that the air bridge is, for example, a structure for establishing an electrical connection by an aerial bridge (i.e., a vertical bridge) formed of a superconductor. Further, in the superconducting circuit 1 according to the present disclosure, each of the SQUIDs 12 is disposed, in an area inside the superconducting loop surrounding the SQUID 12, at a place where a magnetic field generated by a current from a bias line is applied.

In the example shown in FIG. 2, a first end of the SQUID 12G is connected to the qubit 10G and a second end thereof is connected to the ground plane 30. Further, a superconducting loop 15G, which surrounds the SQUID 12G, is formed by a multilevel wiring line 14G, which is an air bridge that crosses over (i.e., crosses above) the qubit 10G, and the ground plane 30. Further, the bias current from the bias line 13G is conducted in two directions different from each other along one side of the superconducting loop.

(Example in which Bias Line is Disposed so as to Extend in Direction Perpendicular to Multilevel Wiring Line)

Figure 3:
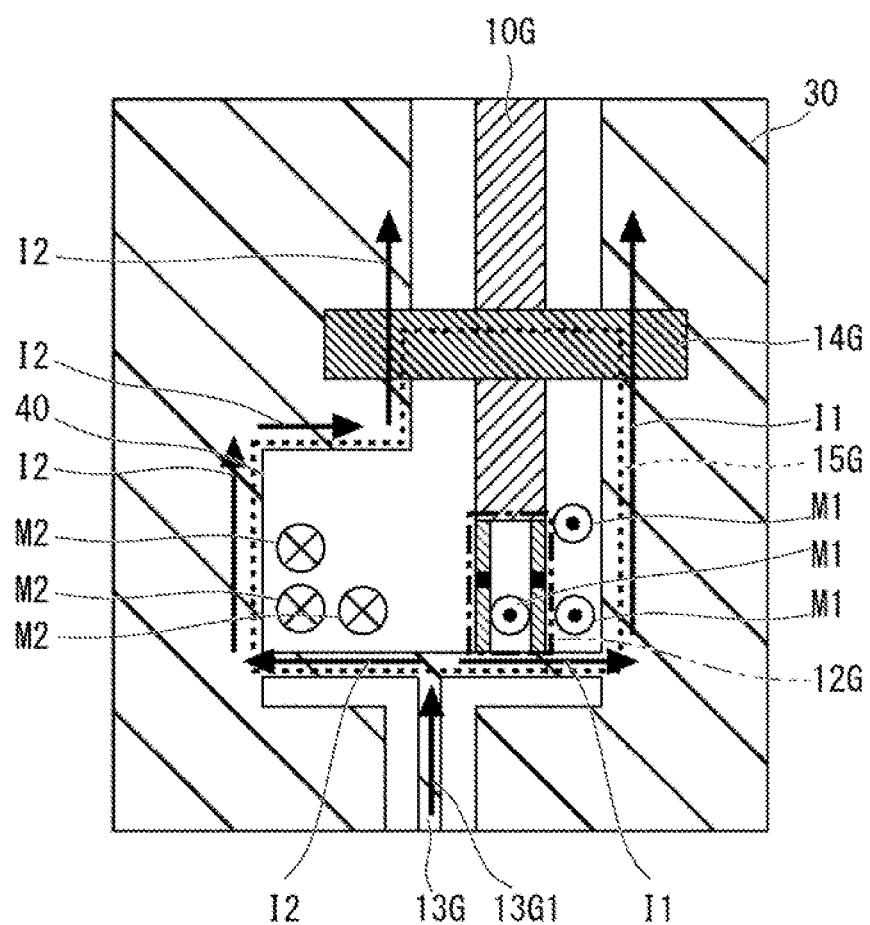
FIG. 3 is a diagram for explaining a configuration according to the first example embodiment and a magnetic field around a SQUID 12G when a bias current flows.
Figure 4:
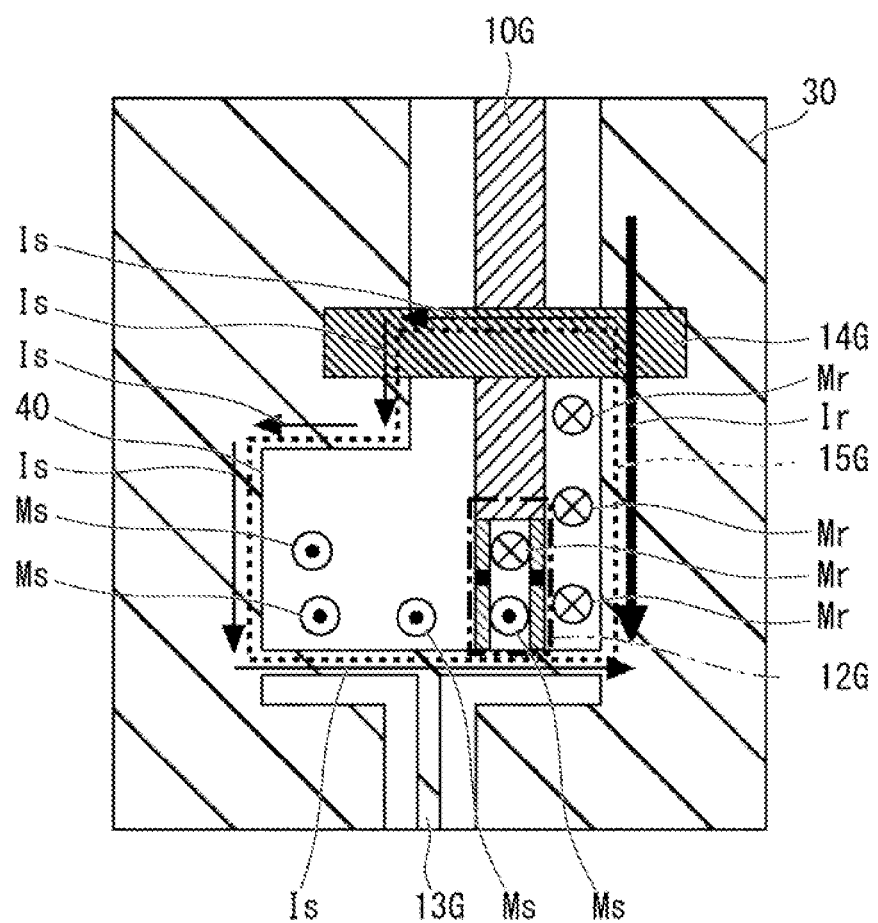
FIG. 4 is a diagram for explaining a magnetic field around the SQUID 12G when a return current flows in the first example embodiment.

An example of a configuration in which a bias line is disposed so as to extend in a direction perpendicular to the multilevel wiring line will be described with reference to FIGS. 3 and 4. FIG. 3 is a diagram for explaining a configuration according to the first example embodiment, and a magnetic field around a SQUID 12G when a bias current flows. FIG. 4 is a diagram for explaining a magnetic field around the SQUID 12G when a return current flows in the first example embodiment. Each of FIGS. 3 and 4 shows an example of an area 301 around the SQUID 12G shown in FIG. 2.

In the example shown in FIG. 3, a bias current 13G1 from the bias line 13G is divided into a branch current I1 which is conducted in a direction that is along one side 302 of the superconducting loop 15G and is approaching the SQUID 12G, and a branch current I2 which is conducted in a direction that is receding from the SQUID 12G. Further, because of the shape of the non-conductive part 40, the part of the ground plane 30 through which the branch current I1 flows in the superconducting loop 15G is closer to the SQUID 12G than the part of the ground plane 30 through which the branch current I2 flows in the superconducting loop 15G is. Therefore, a magnetic flux M1 generated by the branch current I1 is generated relatively strongly in an upward direction at a place where the magnetic flux M1 penetrates the SQUID 12G. Meanwhile, a magnetic flux M2 generated by the branch current I2 is generated relatively weakly in a downward direction at a place whether the magnetic flux M2 penetrates the SQUID 12G. The value of each of the branch currents is determined by the value of the bias current, so that it is possible to change the magnetic flux inside the SQUID 12G by changing the value of the bias current. Therefore, the resonance frequency of the qubit 10G is set by the bias current 13G1.

Note that when a large number of qubits are integrated by using JPOs as qubits 10, it is advantageous to use lumped constant type JPOs having small footprints. However, when lumped constant type JPOs are arranged in a manner similar to that of the LHZ method, the paths of the return currents of the bias currents, which cause crosstalk, becomes more complicated.

As shown in FIG. 4, when a return current Ir caused by a bias current to a SQUID 12 (e.g., the SQUID 12A) other than the SQUID 12G flows to the ground plane 30, a magnetic flux Mr is generated inside the superconducting loop 15G by the return current Ir. Since the magnetic flux inside the area surrounded by the superconducting loop is conserved, a shielding current Is occurs in such a direction that a magnetic flux Ms whose direction is opposite to that of the magnetic flux Mr is generated. Further, the SQUID 12G is provided at a place where the value (strength) of the magnetic flux Mr is roughly equal to that of the magnetic flux Ms in the superconducting loop 15G. Therefore, the magnetic flux Mr is cancelled out by the magnetic flux Ms, so that the change (fluctuation) of the magnetic flux inside the SQUID 12G caused by the return current Ir can be reduced. Therefore, the crosstalk, which would otherwise be caused by the bias current that is applied to apply a magnetic field to a SQUID 12 other than the SQUID 12G, can be appropriately reduced.

Note that, in order to suppress the crosstalk, it is conceivable to provide a larger number of air bridges or the like between the ground planes 30 separated by a coplanar waveguide or the qubit 10 (i.e., the resonator), and thereby form a plurality of low-impedance return lines for magnetic-field bias currents. However, it is considered that when the number of air bridges or the like increases, there is a possibility of the occurrence of a problem that the Q value of the qubit 10 decreases due to a dielectric loss in a dielectric material such as a resist that remains after the air bridges are formed. Further, it is considered that when the production yield of the air bridges or the like is low, a possibility that the qubit 10 may be short-circuited increases. In the examples shown in FIGS. 3 and 4, the crosstalk can be appropriately reduced by one air bridge.

Various modified examples of the first example embodiment will be described hereinafter. Note that example embodiments and modified examples described hereinafter may be combined as appropriate with one another and used in a combined state. In such a case, for example, a qubit 10A may have a structure according to the first example embodiment, and qubits 10B to 10I may have structures according to first to eighth modified examples, respectively, of the first example embodiment. Further, a qubit 10J may have a structure according to a second example embodiment, and qubits 10K to 10M may have structures according to first to third modified examples, respectively, of the second example embodiment. Further, a qubit 10N may have a structure according to a third example embodiment, and qubits 10O to 10T (note that the qubit 10T is not shown in the drawings) may have structures according to first to sixth modified examples, respectively, of the third example embodiment.

First Modified Example of First Example Embodiment: Example in which Bias Line is Disposed so as to Extend in Direction Parallel to Multilevel Wiring Line In FIGS. 3 and 4, an example of a configuration in which the bias line is disposed so as to extend in a direction perpendicular to the multilevel wiring line has been described. An example in which a bias line is disposed so as to extend in a direction parallel to a multilevel wiring line will be described hereinafter with reference to FIGS. 5 and 6.

Figure 5:
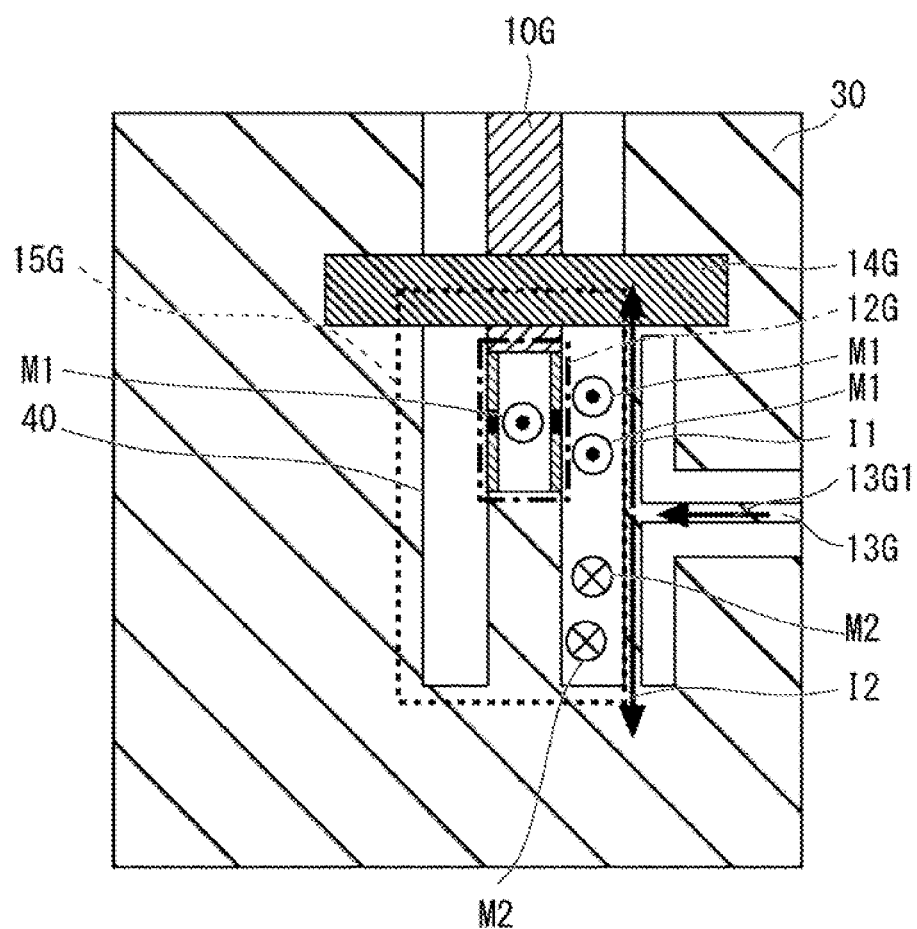
FIG. 5 is a diagram for explaining a configuration of a first modified example of the first example embodiment and a magnetic field around a SQUID 12G when a bias current flows.
Figure 6:
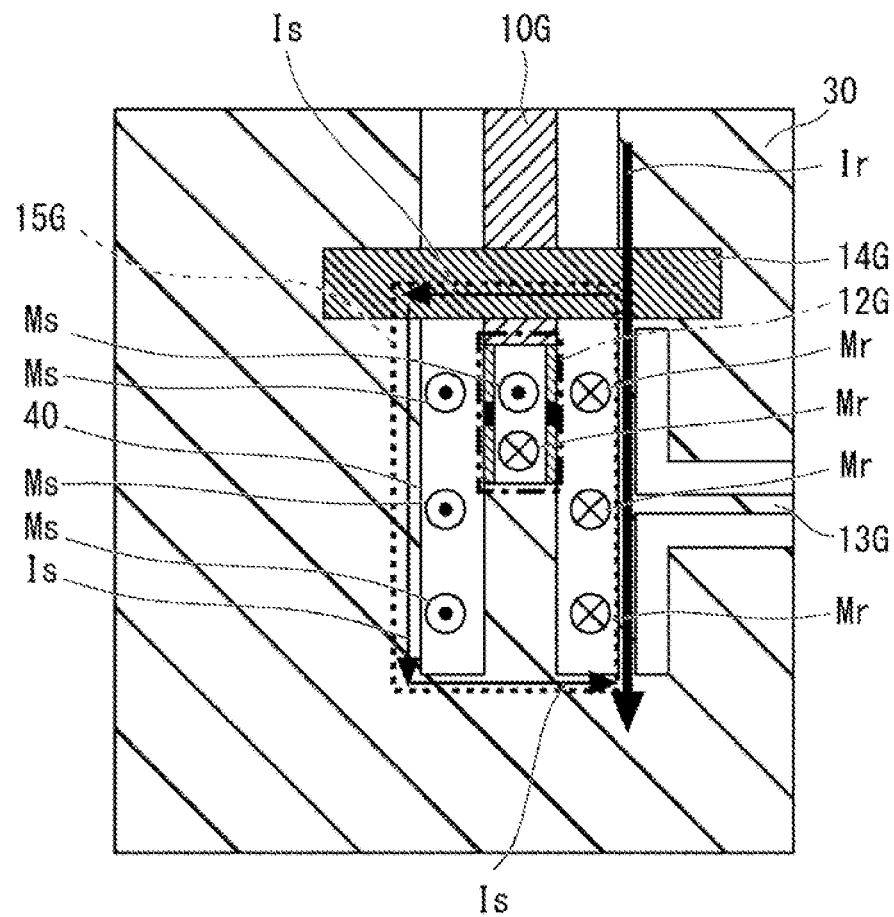
FIG. 6 is a diagram for explaining a magnetic field around the SQUID 12G when a return current flows in the first modified example of the first example embodiment.

FIG. 5 is a diagram for explaining a configuration according to a first modified example of the first example embodiment, and a magnetic field around a SQUID 12G when a bias current flows. FIG. 6 is a diagram for explaining a magnetic field around the SQUID 12G when a return current flows in the first modified example of the first example embodiment.

In the example shown in FIG. 5, similarly to the example shown in FIG. 3, the bias current 13G1 from the bias line 13G is divided into a branch current I1 which is conducted in a direction that is along one side of the superconducting loop 15G and is approaching the SQUID 12G, and a branch current I2 which is conducted in a direction that is receding from the SQUID 12G. Further, by the same principle (explanation) as that in the example shown in FIGS. 3 and 4, effects similar to those in the example shown in FIGS. 3 and 4 can be obtained even when the bias line is disposed so as to extend in the direction parallel to the multilevel wiring line 14G as shown in FIGS. 5 and 6.

Second Modified Example of First Example Embodiment: Example in which Bias Current is not Divided and Plurality of Multilevel Wiring Lines are Used In FIGS. 2 to 6, an example of a configuration in which the superconducting loop 15G surrounding the SQUID 12G is formed by the multilevel wiring line 14G, which is one air bridge, and the ground plane 30, and the bias current is divided has been described. An example of a configuration in which a superconducting loop 15G surrounding a SQUID 12G is formed by multilevel wiring lines 14G1 and 14G2, which are two air bridges, and a ground plane 30, and a bias current is not divided will be described with reference to FIGS. 7 and 8.

Figure 7:
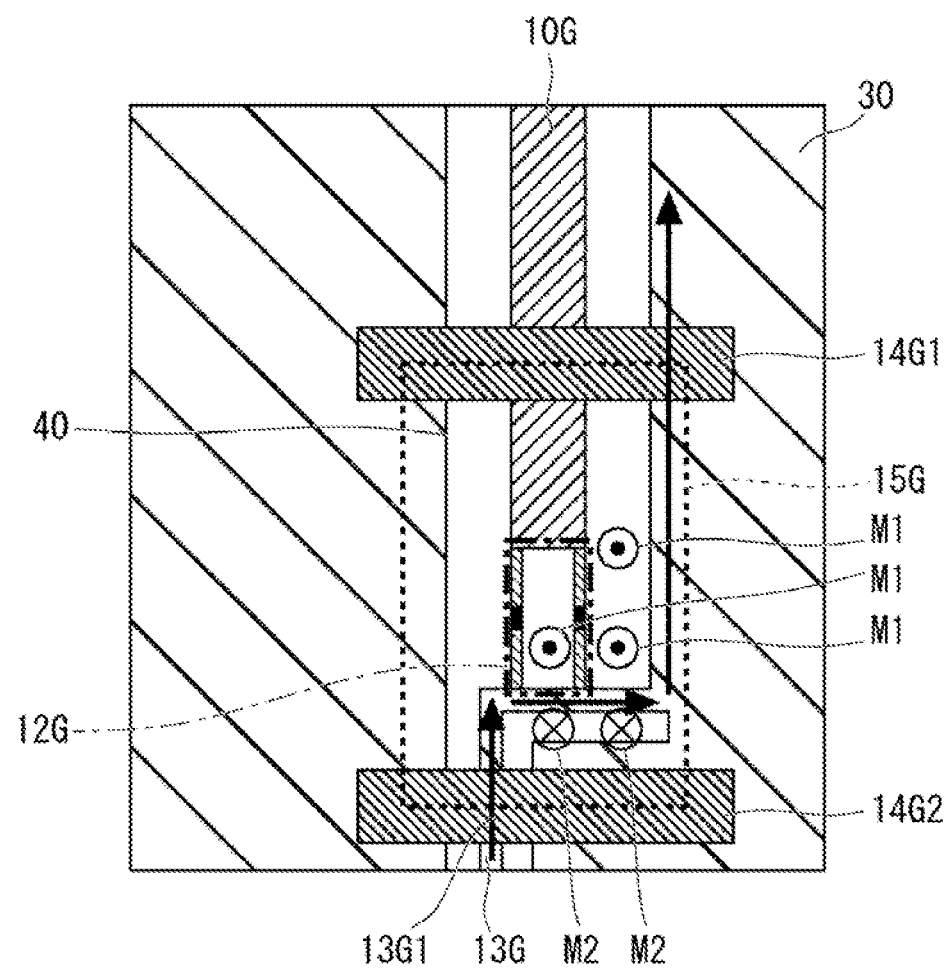
FIG. 7 is a diagram for explaining a configuration of a second modified example of the first example embodiment and a magnetic field around a SQUID 12G when a bias current flows.
Figure 8:
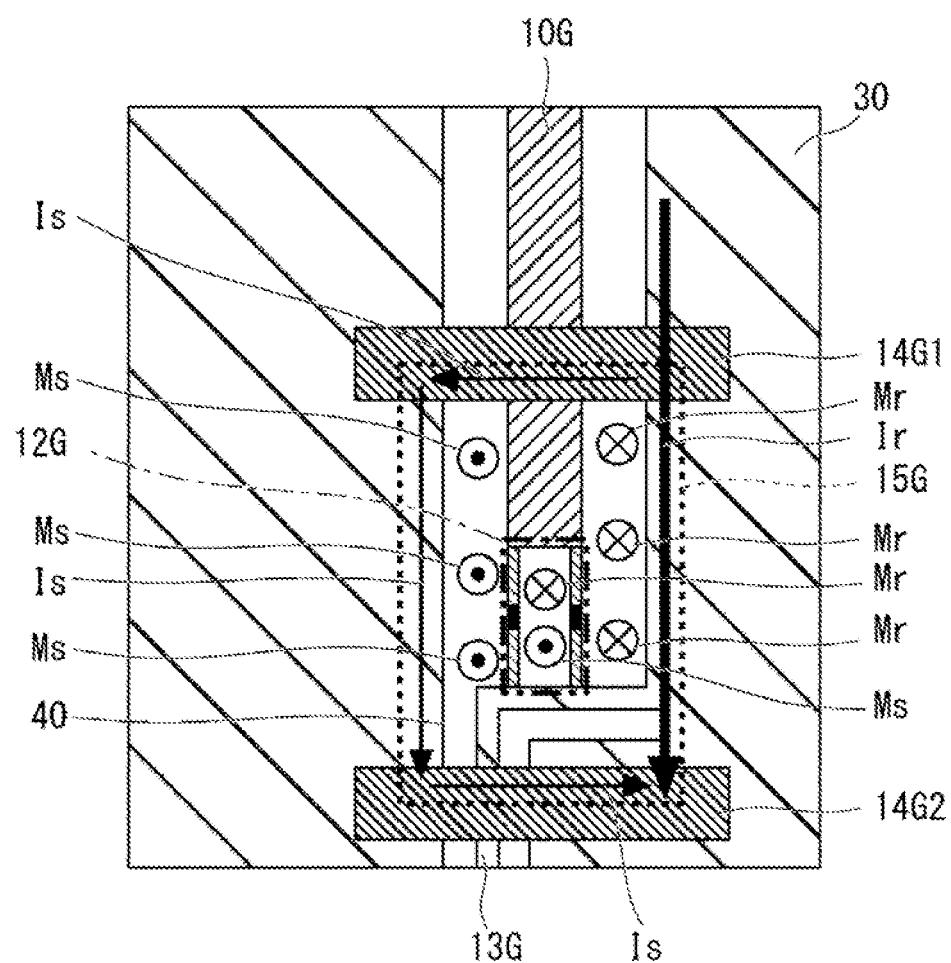
FIG. 8 is a diagram for explaining a magnetic field around the SQUID 12G when a return current flows in the second modified example of the first example embodiment.

FIG. 7 is a diagram for explaining a configuration according to a second modified example of the first example embodiment, and a magnetic field around a SQUID 12G when a bias current flows. FIG. 8 is a diagram for explaining a magnetic field around the SQUID 12G when a return current flows in the second modified example of the first example embodiment.

FIGS. 7 and 8 show an example in which a bias line is disposed so as to extend in a direction perpendicular to a multilevel wiring line. In the examples shown in FIGS. 7 and 8, it is necessary to provide the multilevel wiring line 14G2, which is an air bridge, as compared with the examples shown in FIGS. 2 to 6. However, since the bias current is not divided, the magnetic flux inside the SQUID 12G can be changed by a smaller bias current value. Further, since the multilevel wiring line 14G2 is provided not above the qubit 10G but above the bias line 13G, the influence of the qubit 10G on the Q value is relatively small.

In the example shown in FIG. 7, the bias current 13G1 from the L-shaped bias line 13G is conducted, inside the superconducting loop 15G, only in one direction along one side of the superconducting loop 15G. Therefore, the bias current 13G1 generates two magnetic fluxes M1 and M2 whose directions are opposite to each other inside the superconducting loop 15G. Only the magnetic flux M1, which is one of the magnetic fluxes, is applied to the SQUID 12G. Therefore, it is possible to change the magnetic flux inside the SQUID 12G by changing the value of the bias current 13G1. Accordingly, the resonance frequency of the qubit 10G is set by the bias current 13G1.

Further, as shown in FIG. 8, similarly to the examples shown in FIGS. 4 and 6, when a return current Ir caused by a bias current to a SQUID 12 (e.g., the SQUID 12A) other than the SQUID 12G flows to the ground plane 30, a magnetic flux Mr is generated inside the superconducting loop 15G by the return current Ir. Since the magnetic flux inside the area surrounded by the superconducting loop is conserved, a shielding current Is occurs in such a direction that a magnetic flux Ms whose direction is opposite to that of the magnetic flux Mr is generated. Further, the SQUID 12G is provided at a place where the value (strength) of the magnetic flux Mr is roughly equal to that of the magnetic flux Ms in the superconducting loop 15G. Therefore, the magnetic flux Mr is cancelled out by the magnetic flux Ms, so that the change of the magnetic flux inside the SQUID 12G caused by the return current Ir can be reduced. Therefore, the crosstalk, which would otherwise be caused by the bias current that is applied to apply a magnetic field to a SQUID 12 other than the SQUID 12G, can be appropriately reduced.

Third Modified Example of First Example Embodiment: Example in which Bias Current is not Divided and Plurality of Multilevel Wiring Lines are Used Similarly to the configuration shown in FIGS. 7 and 8, an example of a configuration in which a superconducting loop 15G surrounding a SQUID 12G is formed by multilevel wiring lines 14G1 and 14G2, which are two air bridges, and a ground plane 30 will be described hereinafter with reference to FIGS. 9 and 10. In FIGS. 7 and 8, an example in which the bias line is disposed so as to extend in a direction perpendicular to the multilevel wiring line has been described. In contrast, in FIGS. 9 and 10, an example in which the bias line is disposed so as to extend in a direction parallel to the multilevel wiring line 14G1 that crosses over (i.e., crosses above) the qubit 10G will be described.

Figure 9:
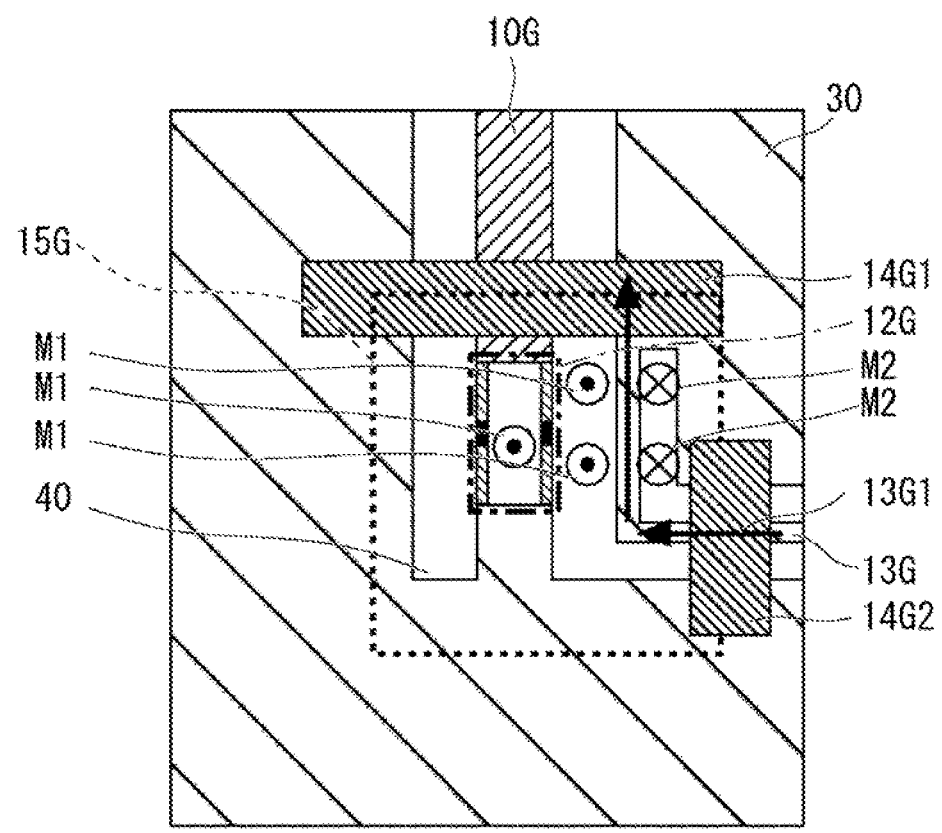
FIG. 9 is a diagram for explaining a configuration of a third modified example of the first example embodiment and a magnetic field around a SQUID 12G when a bias current flows.
Figure 10:
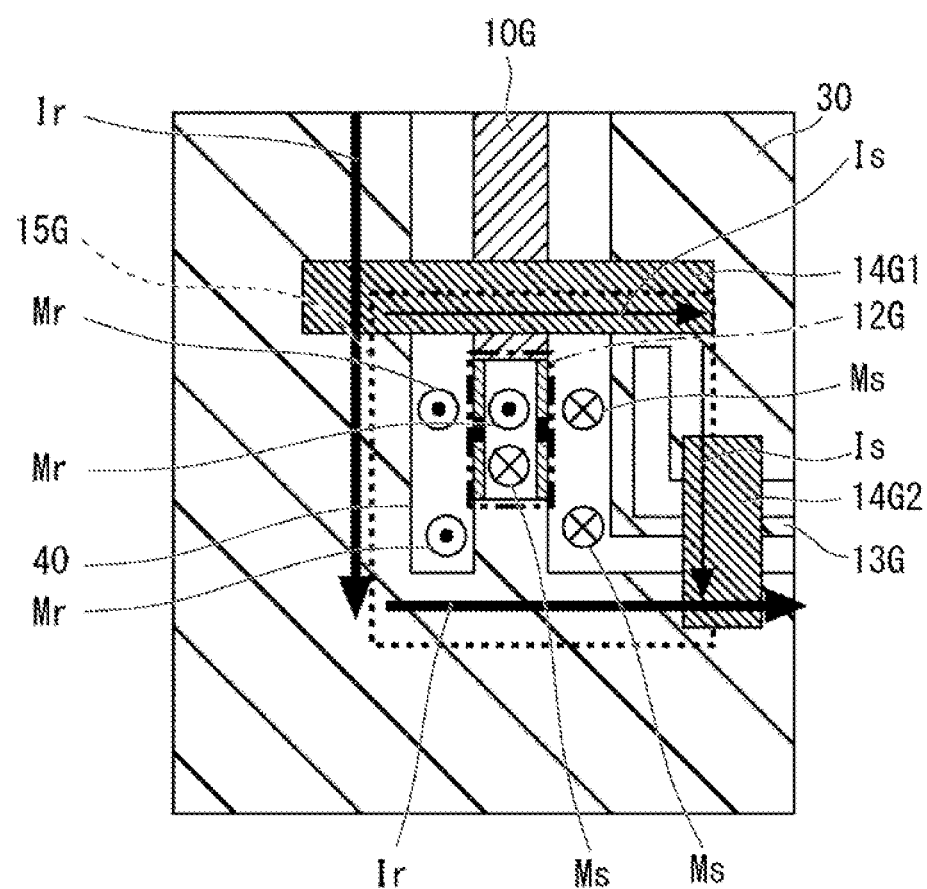
FIG. 10 is a diagram for explaining a magnetic field around the SQUID 12G when a return current flows in the third modified example of the first example embodiment.

FIG. 9 is a diagram for explaining a configuration according to a third modified example of the first example embodiment, and a magnetic field around a SQUID 12G when a bias current flows. FIG. 10 is a diagram for explaining a magnetic field around the SQUID 12G when a return current flows in the third modified example of the first example embodiment. In the example shown in FIG. 9, similarly to the example shown in FIG. 7, the bias current 13G1 from the L-shaped bias line 13G is conducted, inside the superconducting loop 15G, only in one direction along one side of the superconducting loop 15G. Further, by the same principle (explanation) as that in the example shown in FIGS. 7 and 8, effects similar to those in the example shown in FIGS. 7 and 8 can be obtained even when the bias line is disposed so as to extend in the direction parallel to the multilevel wiring line 14G1, which is an air bridge that crosses over the qubit 10G, as shown in FIGS. 9 and 10.

Figure 11:
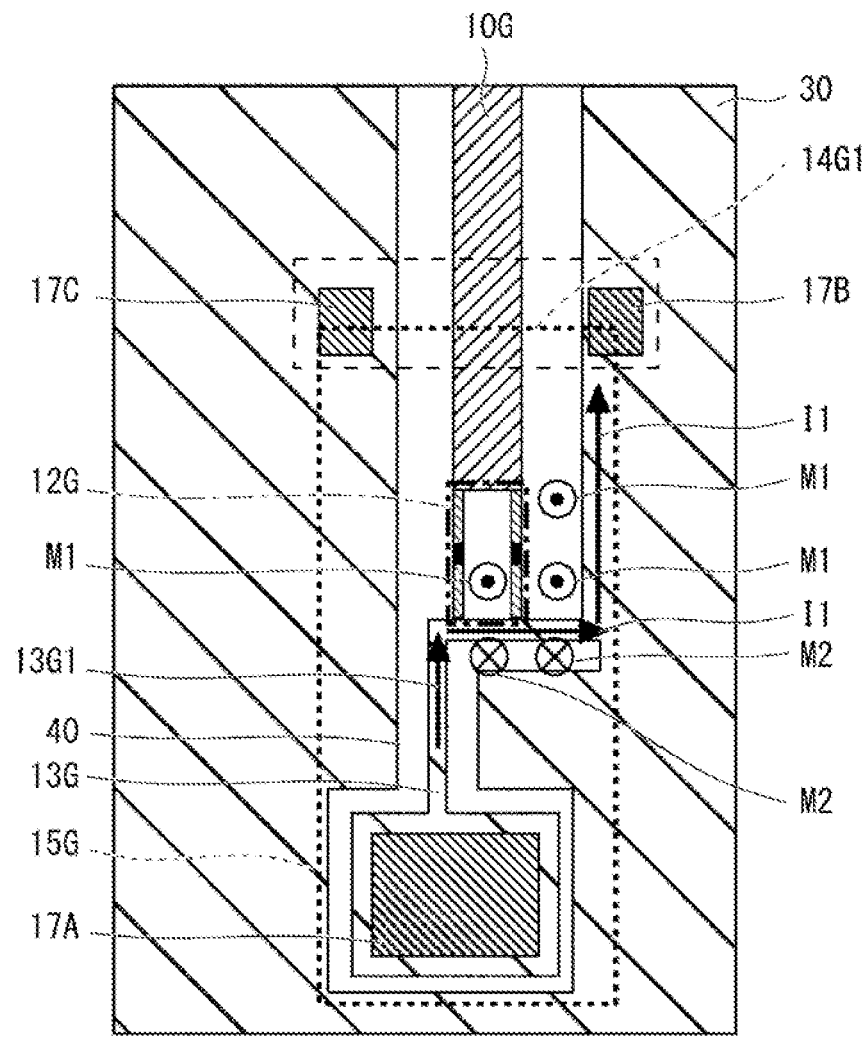
FIG. 11 is a diagram for explaining a configuration of a fourth modified example of the first example embodiment and a magnetic field around a SQUID 12G when a bias current flows.
Figure 12:
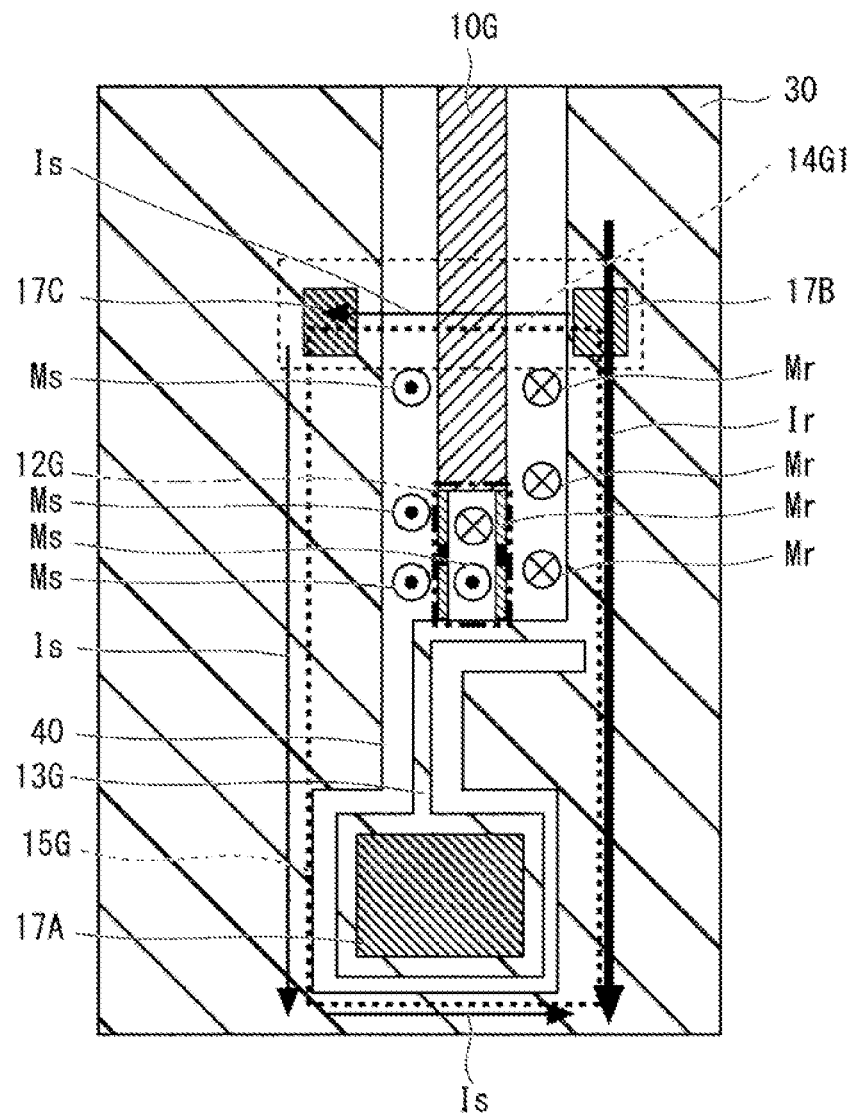
FIG. 12 is a diagram for explaining a magnetic field around the SQUID 12G when a return current flows in the fourth modified example of the first example embodiment.

Fourth Modified Example of First Example Embodiment: Example in which Interposer is Used as Multilevel Wiring Line In FIGS. 2 to 10, examples in which an air bridge is used as a multilevel wiring line have been described. An example in which an interposer is used as a multilevel wiring line will be described hereinafter with reference to FIGS. 11 and 12. FIGS. 11 and 12 show an example in which a bias line is disposed so as to extend in a direction perpendicular to a multilevel wiring line. Note that the interposer may be, for example, a substrate in which circuits formed on the front and rear surfaces are electrically connected by through electrodes.

FIG. 11 is a diagram for explaining a configuration according to a fourth modified example of the first example embodiment, and a magnetic field around a SQUID 12G when a bias current flows. FIG. 12 is a diagram for explaining a magnetic field around the SQUID 12G when a return current flows in the fourth modified example of the first example embodiment. In the example shown in FIG. 11, similarly to the examples shown in FIGS. 7 and 9, the bias current 13G1 from the L-shaped bias line 13G is conducted, inside the superconducting loop 15G, only in one direction along one side of the superconducting loop 15G. Further, in the example shown in FIG. 11, a bias current 13G1 is supplied from a junction surface (e.g., a through electrode) 17A of the interposer to the L-shaped bias line 13G. Further, junction surfaces 17B and 17C with the interposer are provided near the SQUID 12G. Therefore, a superconducting loop 15G surrounding the SQUID 12G is formed by the multilevel wiring line 14G1 disposed inside the interposer, which electrically connects the junction surfaces 17B and 17C to each other, and the ground plane 30. Note that, in the junction surfaces 17B and 17C, for example, the ground plane 30 of the superconducting circuit 1 is connected to the surface of the interposer on the side on which the superconducting circuit 1 is located by bumps or the like. Therefore, the ground planes 30 on both sides of the qubit 10G are electrically connected to each other through a connection part(s) (a superconducting member(s)) disposed in the surface of the interposer on the side on which the superconducting circuit 1 is located. Further, by the same principle (explanation) as that in the example shown in FIGS. 7 and 8, effects similar to those in the example shown in FIGS. 7 and 8 can be obtained even in the configuration shown in FIGS. 11 and 12.

Figure 13:
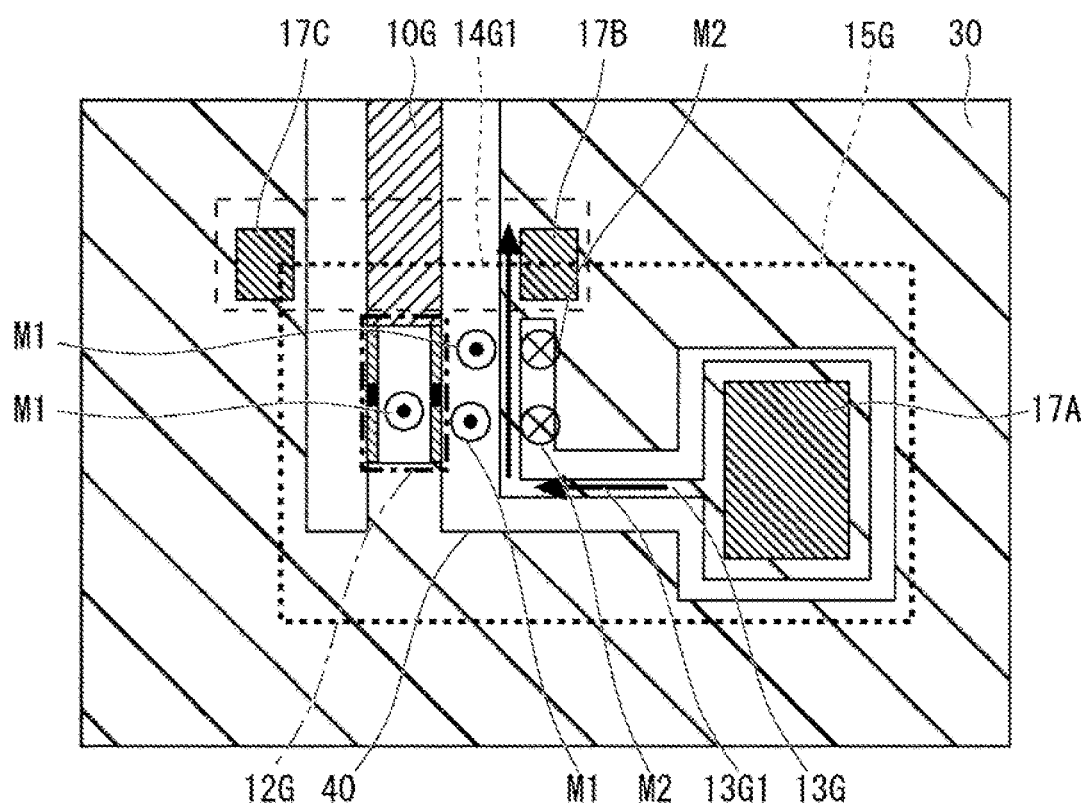
FIG. 13 is a diagram for explaining a configuration of a fifth modified example of the first example embodiment and a magnetic field around a SQUID 12G when a bias current flows.
Figure 14:
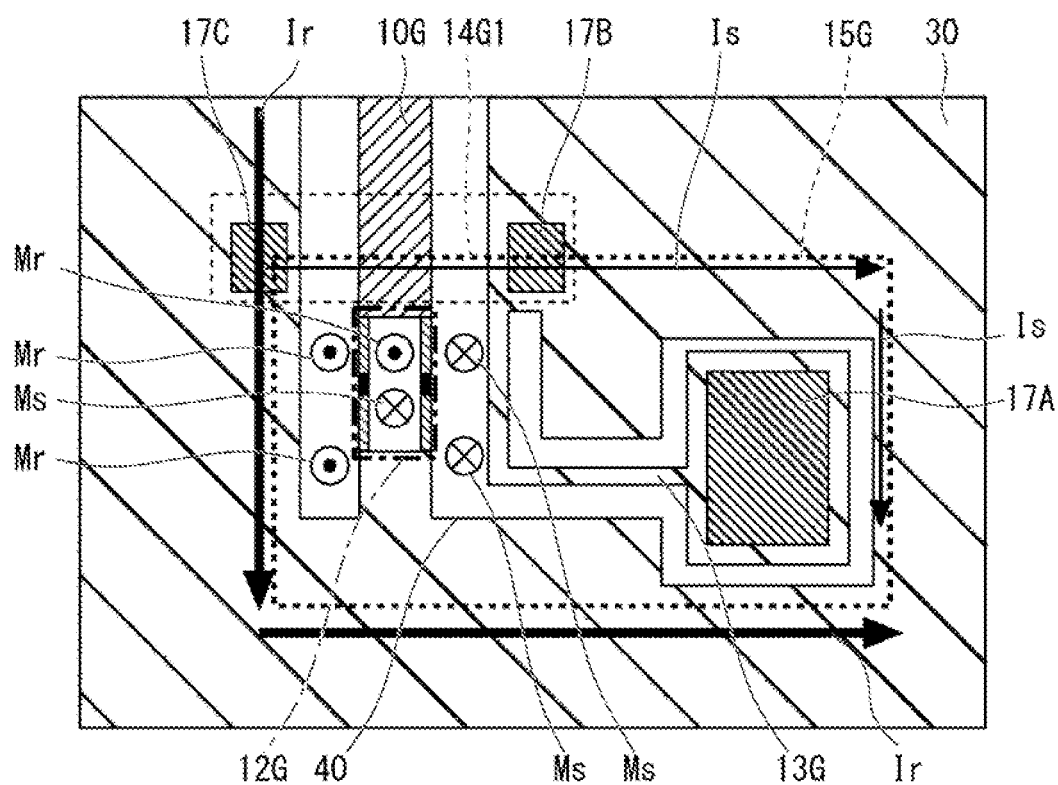
FIG. 14 is a diagram for explaining a magnetic field around the SQUID 12G when a return current flows in the fifth modified example of the first example embodiment.

Fifth Modified Example of First Example Embodiment: Example in which Interposer is Used as Multilevel Wiring Line In FIGS. 11 and 12, an example in which the bias line is disposed so as to extend in a direction perpendicular to the multilevel wiring line has been described. In FIGS. 13 and 14, an example in which the bias line is disposed so as to extend in a direction parallel to the multilevel wiring line 14G1 that crosses over the qubit 10G will be described.

FIG. 13 is a diagram for explaining a configuration according to a fifth modified example of the first example embodiment, and a magnetic field around a SQUID 12G when a bias current flows. FIG. 14 is a diagram for explaining a magnetic field around the SQUID 12G when a return current flows in the fifth modified example of the first example embodiment. In the example shown in FIG. 13, similarly to the example shown in FIG. 11, a bias current 13G1 is supplied from the junction surface 17A of the interposer to the L-shaped bias line 13G. Further, junction surfaces 17B and 17C with the interposer are provided near the SQUID 12G. Therefore, a superconducting loop 15G surrounding the SQUID 12G is formed by the multilevel wiring line 14G1 disposed inside the interposer, which electrically connects the junction surfaces 17B and 17C to each other, and the ground plane 30.

In the example shown in FIG. 13, similarly to the examples shown in FIGS. 7, 9 and 11, the bias current 13G1 from the L-shaped bias line 13G is conducted, inside the superconducting loop 15G, only in one direction along one side of the superconducting loop 15G. Further, by the same principle (explanation) as that in the example shown in FIGS. 7 and 8, effects similar to those in the example shown in FIGS. 7 and 8 can be obtained even in the configuration shown in FIGS. 13 and 14.

Figure 15:
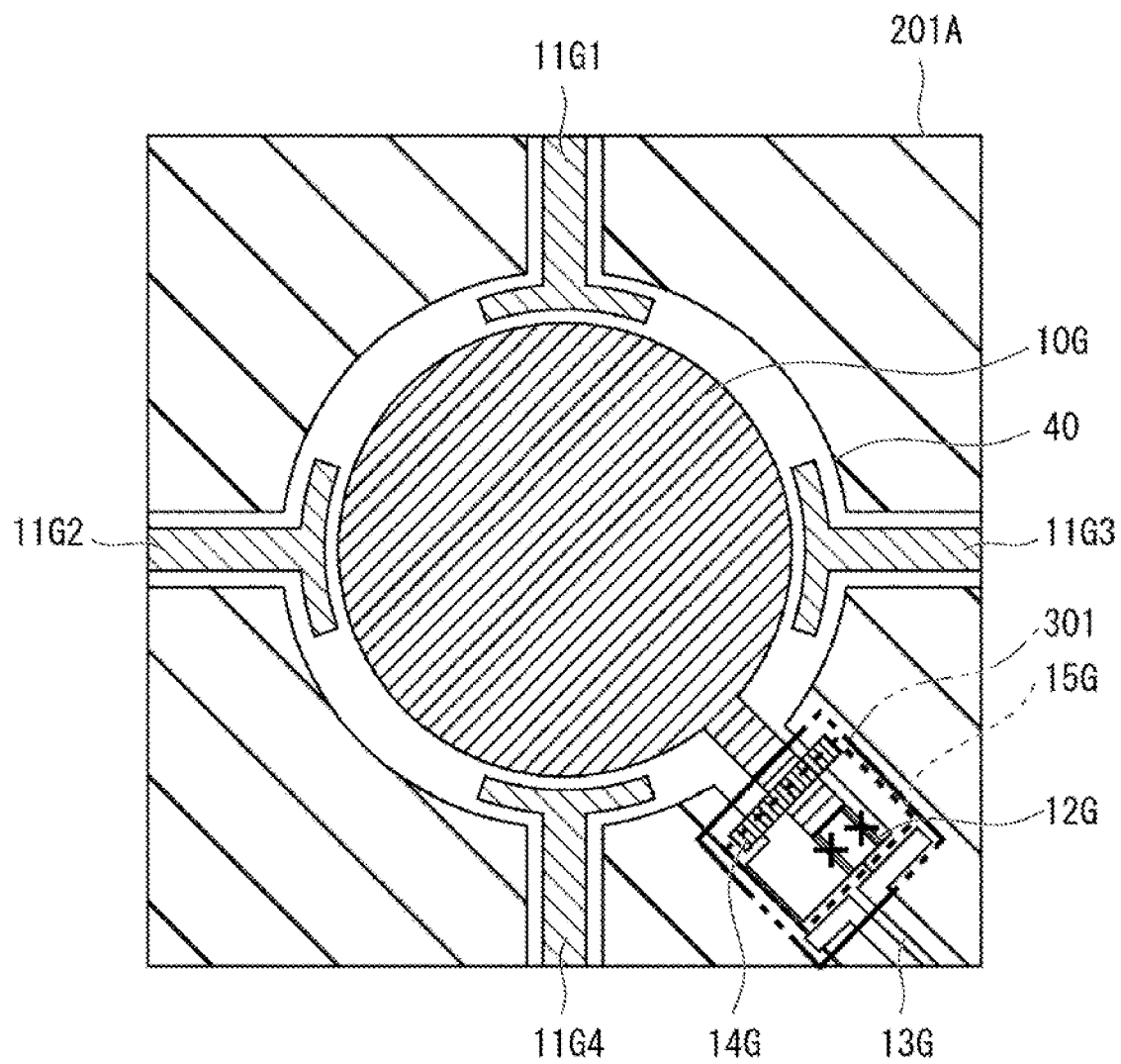
FIG. 15 shows an example of a configuration around a qubit 10G in a superconducting circuit 1 according to a sixth modified example of the first example embodiment.

Sixth Modified Example of First Example Embodiment: Example in which Qubit 10 Having O-Shaped Structure is Used In FIGS. 1 and 2, an example in which a cross-shaped qubit 10 is used has been described. An example in which an O-shaped qubit 10 is used will be described hereinafter with reference to FIG. 15. FIG. 15 shows an example of a configuration around a qubit 10G in a superconducting circuit 1 according to a sixth modified example of the first example embodiment. The shape of the qubit 10 is not limited to the cross shape shown in FIGS. 1 and 2, but an O-shaped qubit may be used. In this case, the inside of the area 201 shown in FIG. 1 may be configured as an area 201A shown in FIG. 15. In the example shown in FIG. 15, four coupling ports 11G1, 11G2, 11G3 and 11G4 are provided on the outer periphery of the O-shaped structure. Even in the example shown in FIG. 15, the inside of the area 301 may have any of the configurations shown in FIGS. 3 and 4, FIGS. 5 and 6, FIGS. 7 and 8, FIGS. 9 and 10, FIGS. 11 and 12, and FIGS. 13 and 14.

Figure 16:
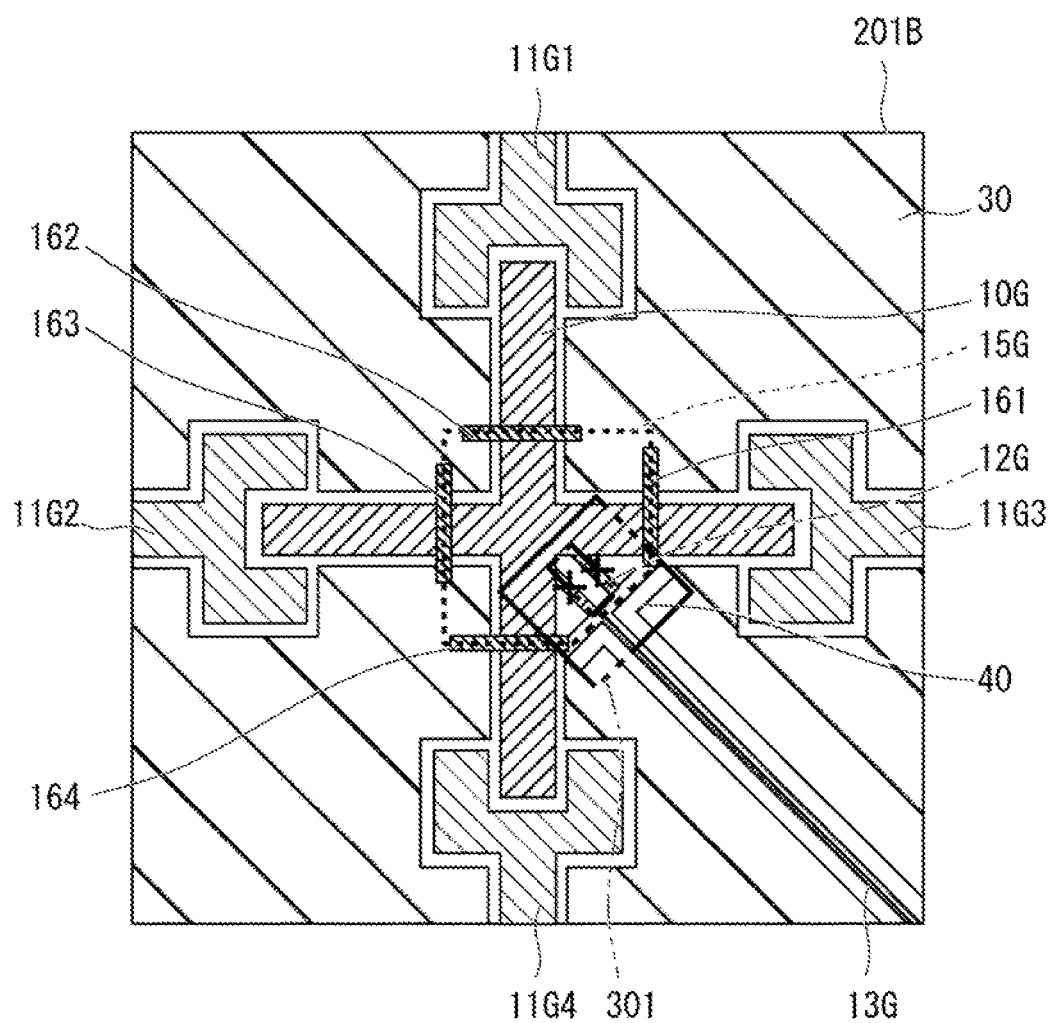
FIG. 16 shows an example of a configuration around a qubit 10G in a superconducting circuit 1 according to a seventh modified example of the first example embodiment.

Seventh Modified Example of First Example Embodiment: Example in which Four Multilevel Wiring Lines are Used FIG. 16 shows an example of a configuration around a qubit 10G in a superconducting circuit 1 according to a seventh modified example of the first example embodiment. A superconducting loop 15G surrounding a SQUID 12G may be formed by using, instead of the configuration in the area 201 shown in FIG. 2, four multilevel wiring lines 161, 162, 163 and 164 as shown in the area 201B shown in FIG. 16. Even in the example shown in FIG. 16, the inside of the area 301 may have any of the configurations shown in FIGS. 3 and 4, FIGS. 5 and 6, FIGS. 7 and 8, FIGS. 9 and 10, FIGS. 11 and 12, and FIGS. 13 and 14. In this way, by the same principle (explanation) as that in any of the examples shown in FIGS. 3 and 4, FIGS. 5 and 6, FIGS. 7 and 8, FIGS. 9 and 10, FIGS. 11 and 12, and FIGS. 13 and 14, similar effects can be obtained.

Figure 17:
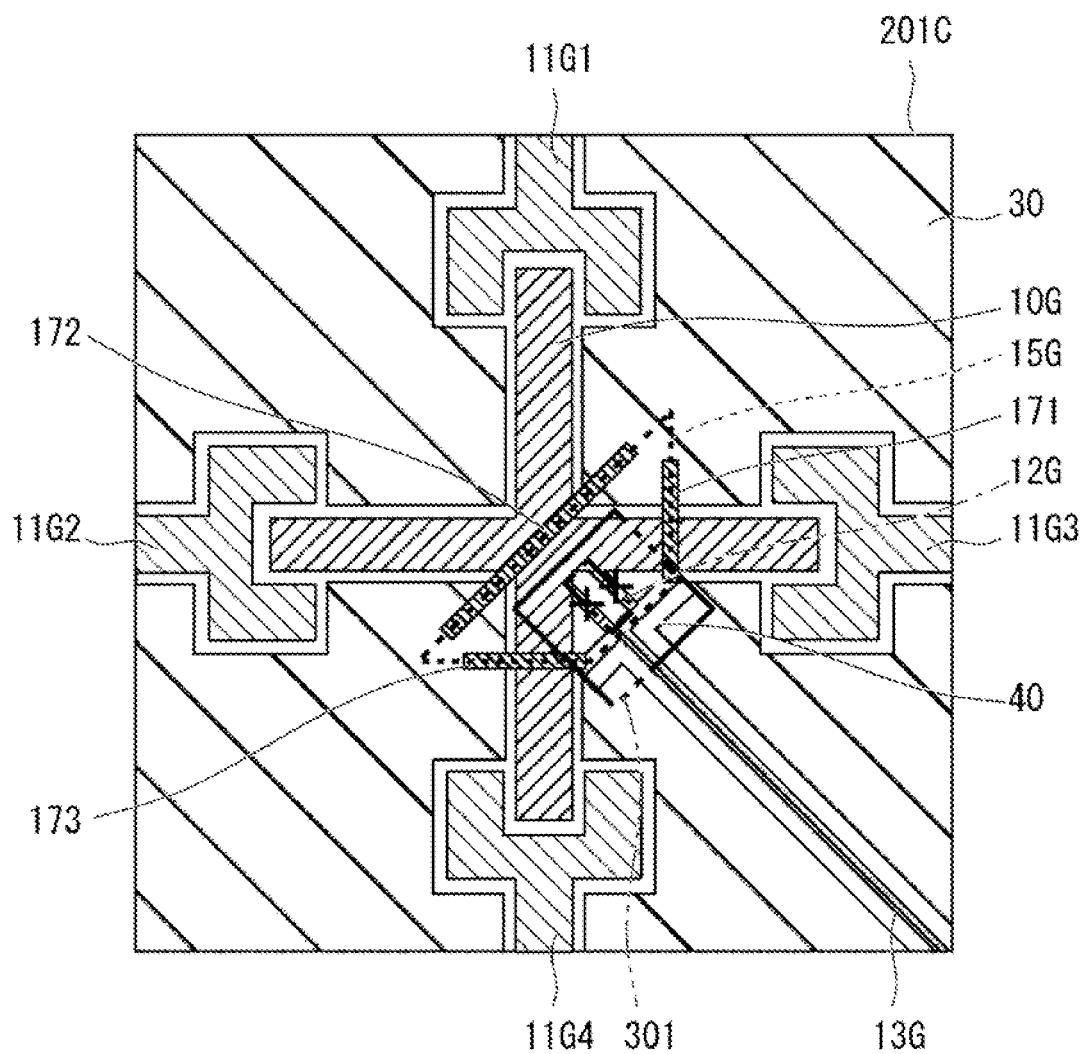
FIG. 17 shows an example of a configuration around a qubit 10G in a superconducting circuit 1 according to an eighth modified example of the first example embodiment.

Eighth Modified Example of First Example Embodiment: Example in which Three Multilevel Wiring Lines are Used FIG. 17 shows an example of a configuration around a qubit 10G in a superconducting circuit 1 according to an eighth modified example of the first example embodiment. A superconducting loop 15G surrounding a SQUID 12G may be formed by using, instead of the configuration in the area 201 shown in FIG. 2, three multilevel wiring lines 171, 172 and 173 as shown in the area 201C shown in FIG. 17. Even in the example shown in FIG. 17, the inside of the area 301 may have any of the configurations shown in FIGS. 3 and 4, FIGS. 5 and 6, FIGS. 7 and 8, FIGS. 9 and 10, FIGS. 11 and 12, and FIGS. 13 and 14. In this way, by the same principle (explanation) as that in any of the examples shown in FIGS. 3 and 4, FIGS. 5 and 6, FIGS. 7 and 8, FIGS. 9 and 10, FIGS. 11 and 12, and FIGS. 13 and 14, similar effects can be obtained.

Second Example Embodiment: Example in which Qubit 10 in which Two L-Shaped Structures Each Having Two Coupling Parts are Connected by SQUID 12 is Used In the first example embodiment, as shown in FIGS. 2 and 15, an example of a configuration in which a SQUID 12 is connected to a cross-shaped or O-shaped qubit 10 has been described. In the second example embodiment, as shown in FIG. 18, an example in which a qubit 10 in which two L-shaped structures each having two coupling parts (a "first part" and a "second part") are connected to each other by a SQUID 12 is used will be described.

Figure 18:
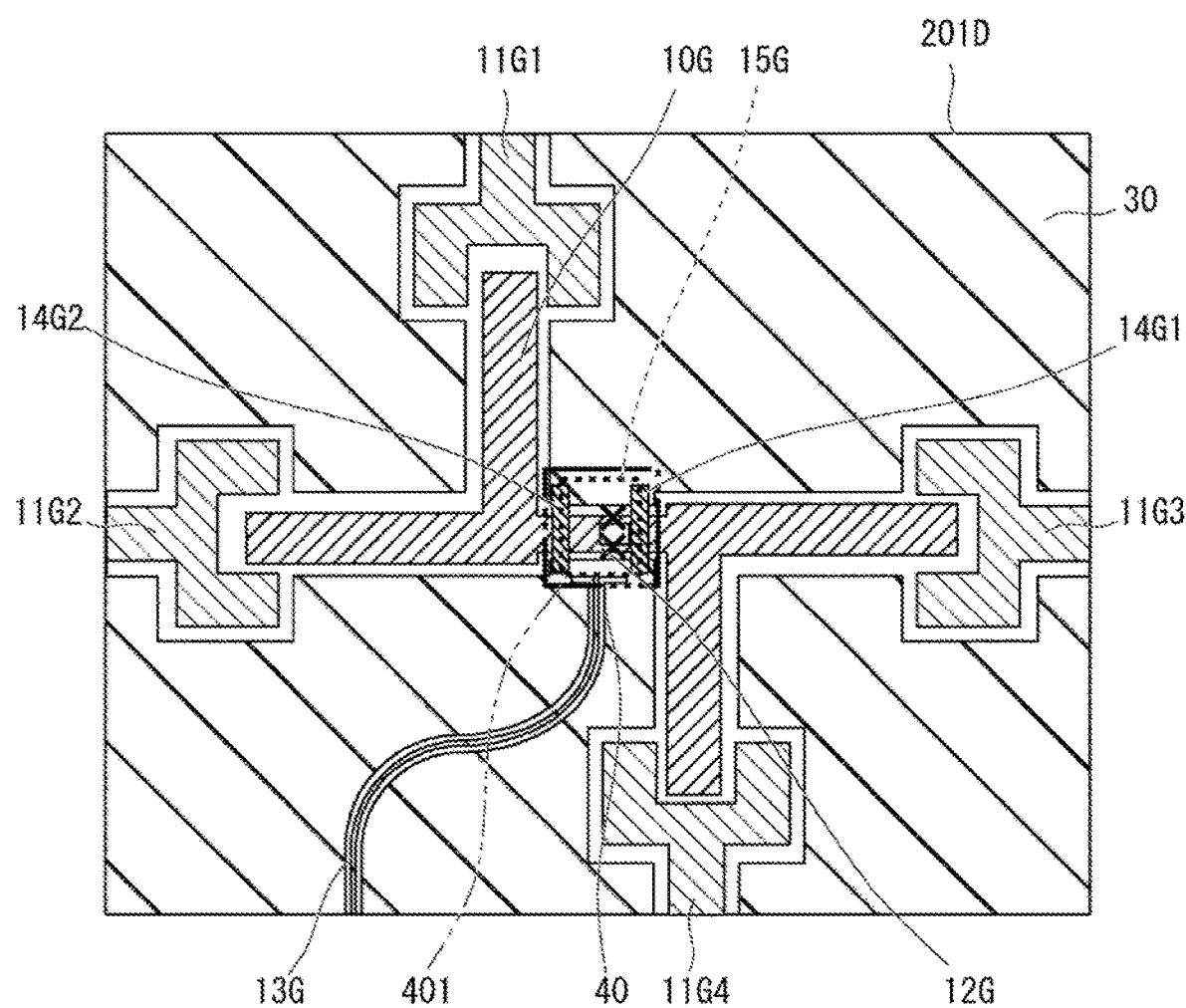
FIG. 18 shows an example of a configuration around a qubit 10G in a superconducting circuit 1 according to a second example embodiment.

FIG. 18 shows an example of a configuration around a qubit 10G in a superconducting circuit 1 according to the second example embodiment. The superconducting circuit 1 according to the second example embodiment has a configuration which is obtained by replacing the area 201 in FIG. 1 by an area 201D shown in FIG. 18. In the second example embodiment, for example, the SQUID 12 is not connected to the ground (is not electrically connected to the ground plane 30). In this way, it is possible to reduce the risk of electrostatic breakdown of the Josephson junction (Josephson device) included in the SQUID 12.

Figure 19:
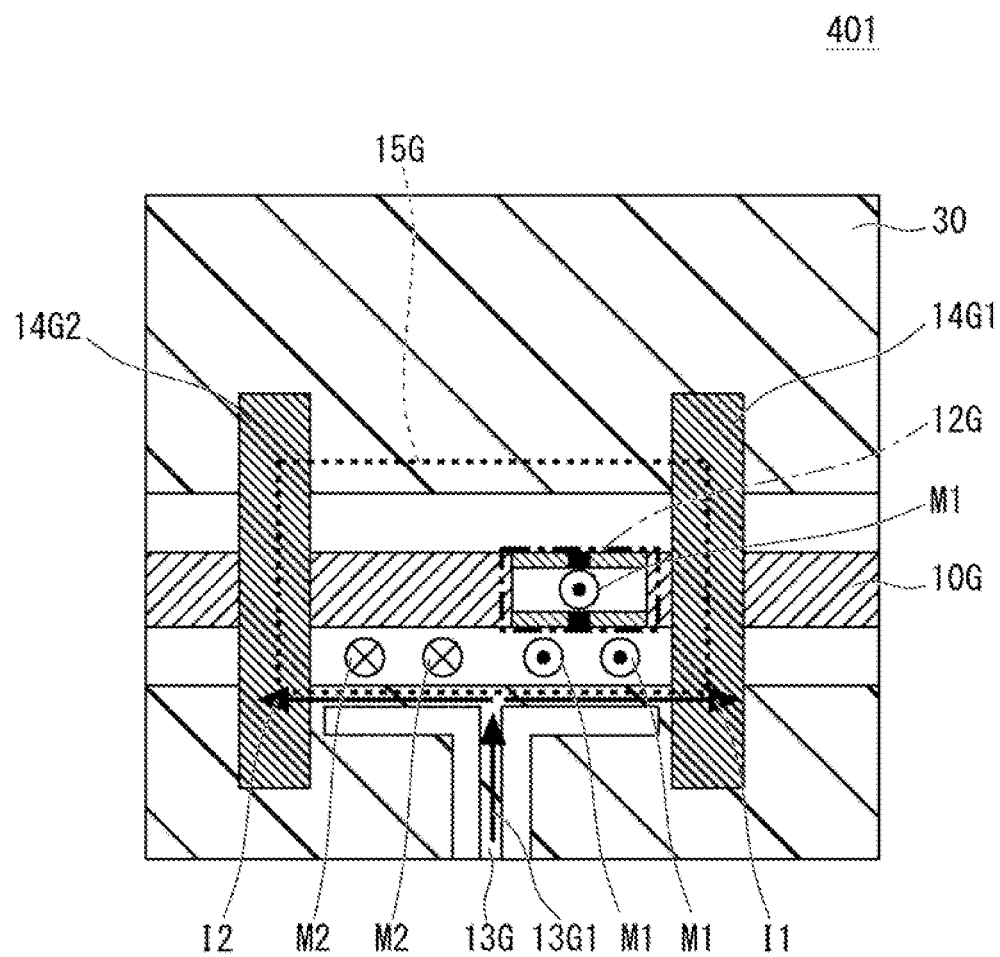
FIG. 19 is a diagram for explaining a configuration according to the second example embodiment and a magnetic field around a SQUID 12G when a bias current flows.
Figure 20:
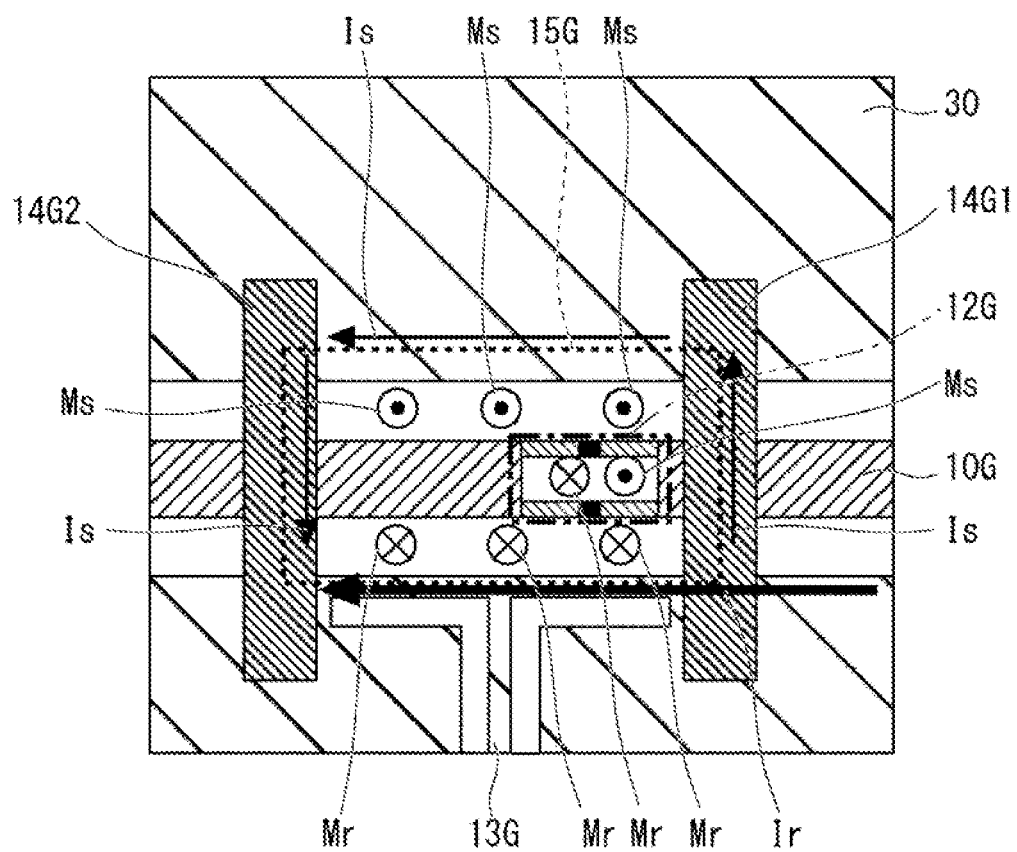
FIG. 20 is a diagram for explaining a magnetic field around the SQUID 12G when a return current flows in the second example embodiment.

FIG. 19 is a diagram for explaining a configuration according to the second example embodiment, and a magnetic field around a SQUID 12G when a bias current flows. FIG. 20 is a diagram for explaining a magnetic field around the SQUID 12G when a return current flows in the second example embodiment. Each of FIGS. 19 and 20 shows an example of an area 401 around the SQUID 12G shown in FIG. 18.

In the example shown in FIG. 19, the qubit 10G has two parts each of which has an L-shaped structure. Further, one end of the SQUID 12G is electrically connected to the first part of the qubit 10G and the other end thereof is connected to the second part of the qubit 10G. Further, in the example shown in FIG. 19, the qubit 10G has multilevel wiring lines 14G1 and 14G2 which forms, in cooperation with the ground plane 30, the superconducting loop 15G. Further, in the example shown in FIG. 19, similarly to the example shown in FIG. 3, the bias current 13G1 from the bias line 13G is divided into a branch current I1 which is conducted in a direction that is along one side of the superconducting loop and is approaching the SQUID 12G, and a branch current I2 which is conducted in a direction that is receding from the SQUID 12G. Since the branch currents I1 and I2 generate magnetic fluxes in directions opposite to each other in the superconducting loop 15G, the magnetic fluxes inside the superconducting loop 15G are maintained. Further, the part of the ground plane 30 through which the branch current I1 flows in the superconducting loop 15G is closer to the SQUID 12G than the part of the ground plane 30 through which the branch current I2 flows in the superconducting loop 15G is. The value of each of the branch currents is determined by the value of the bias current, so that it is possible to change the magnetic flux inside the SQUID 12G by changing the value of the bias current. Therefore, the resonance frequency of the qubit 10G is set by the bias current 13G1.

Further, as shown in FIG. 20, similarly to the example shown in FIG. 4, when a return current Ir caused by a bias current to a SQUID 12 (e.g., the SQUID 12A) other than the SQUID 12G flows to the ground plane 30, a magnetic flux Mr is generated inside the superconducting loop 15G by the return current Ir. Since the magnetic flux inside the area surrounded by the superconducting loop is conserved, a shielding current Is occurs in such a direction that a magnetic flux Ms whose direction is opposite to that of the magnetic flux Mr is generated. Further, the SQUID 12G is provided at a place where the value (strength) of the magnetic flux Mr is roughly equal to that of the magnetic flux Ms in the superconducting loop 15G. Therefore, the magnetic flux Mr is cancelled out by the magnetic flux Ms, so that the change of the magnetic flux inside the SQUID 12G caused by the return current Ir can be reduced. Therefore, the crosstalk, which would otherwise be caused by the bias current that is applied to apply a magnetic field to a SQUID 12 other than the SQUID 12G, can be appropriately reduced.

First Modified Example of Second Example Embodiment: Example of Configuration in which Bias Current is not Divided In FIGS. 19 and 20, an example of a configuration in which the bias current is divided in the second example embodiment has been described. An example of a configuration in which the bias current is not divided in the second example embodiment will be described hereinafter with reference to FIGS. 21 and 22.

Figure 21:
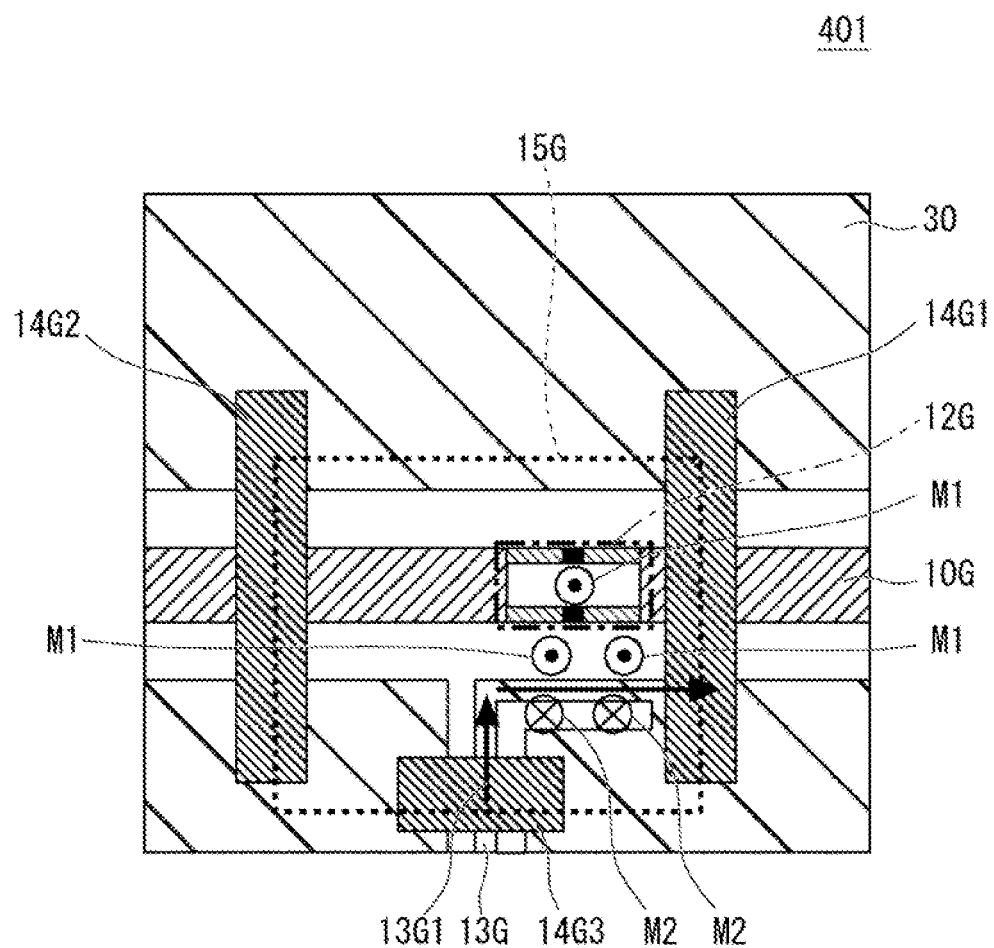
FIG. 21 is a diagram for explaining a configuration of a first modified example of the second example embodiment and a magnetic field around a SQUID 12G when a bias current flows.
Figure 22:
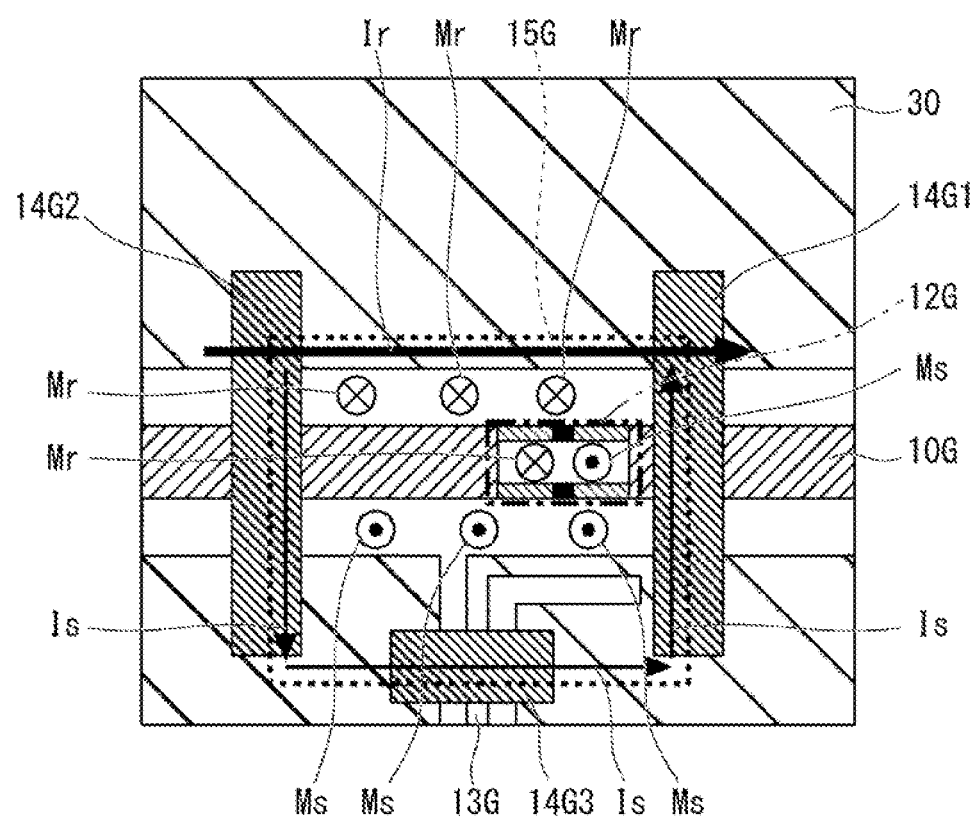
FIG. 22 is a diagram for explaining a magnetic field around the SQUID 12G when a return current flows in the first modified example of the second example embodiment.

FIG. 21 is a diagram for explaining a configuration according to a first modified example of the second example embodiment, and a magnetic field around a SQUID 12G when a bias current flows. FIG. 22 is a diagram for explaining a magnetic field around the SQUID 12G when a return current flows in the first modified example of the second example embodiment. In the example shown in FIG. 21, a multilevel wiring line 14G3, which is an air bridge, is provided above the bias line 13G, and a superconducting loop 15G surrounding the SQUID 12G is formed by multilevel wiring lines 14G1, 14G2 and 14G3, and the ground plane 30.

In the examples shown in FIGS. 21 and 22, it is necessary to provide the multilevel wiring line 14G3, which is an air bridge, as compared with the examples shown in FIGS. 19 and 20. However, since the bias current is not divided, the magnetic flux inside the SQUID 12G can be changed by a smaller bias current value. Further, since the multilevel wiring line 14G3 is provided not above the qubit 10G but above the bias line 13G, the influence of the qubit 10G on the Q value is relatively small.

In the example shown in FIG. 21, one end of the SQUID 12G is electrically connected to the first part of the qubit 10G and the other end thereof is connected to the second part of the qubit 10G. Further, in the example shown in FIG. 21, the qubit 10G has multilevel wiring lines 14G1 and 14G2 which forms, in cooperation with the ground plane 30, the superconducting loop 15G. Further, in the example shown in FIG. 21, similarly to the example shown in FIG. 7, the bias current 13G1 from the L-shaped bias line 13G is conducted, inside the superconducting loop 15G, only in one direction along one side of the superconducting loop 15G. Therefore, it is possible to change the magnetic flux M1 inside the SQUID 12G by changing the value of the bias current 13G1. Therefore, the resonance frequency of the qubit 10G is set by the bias current 13G1.

Further, as shown in FIG. 22, similarly to the examples shown in FIG. 4 and the like, when a return current Ir caused by a bias current to a SQUID 12 (e.g., the SQUID 12A) other than the SQUID 12G flows to the ground plane 30, a magnetic flux Mr is generated inside the superconducting loop 15G by the return current Ir. Since the magnetic flux inside the area surrounded by the superconducting loop is conserved, a shielding current Is occurs in such a direction that a magnetic flux Ms whose direction is opposite to that of the magnetic flux Mr is generated. Further, the SQUID 12G is provided at a place where the value (strength) of the magnetic flux Mr is roughly equal to that of the magnetic flux Ms in the superconducting loop 15G. Therefore, the magnetic flux Mr is cancelled out by the magnetic flux Ms, so that the change of the magnetic flux inside the SQUID 12G caused by the return current Ir can be reduced. Therefore, the crosstalk, which would otherwise be caused by the bias current that is applied to apply a magnetic field to a SQUID 12 other than the SQUID 12G, can be appropriately reduced.

Second Modified Example of Second Example Embodiment: Example in which Interposer is Used as Multilevel Wiring Line In FIGS. 19 to 22, examples in which an air bridge is used as a multilevel wiring line in the second example embodiment have been described. An example in which an interposer is used as a multilevel wiring line in the second example embodiment will be described hereinafter with reference to FIGS. 23 and 24.

Figure 23:
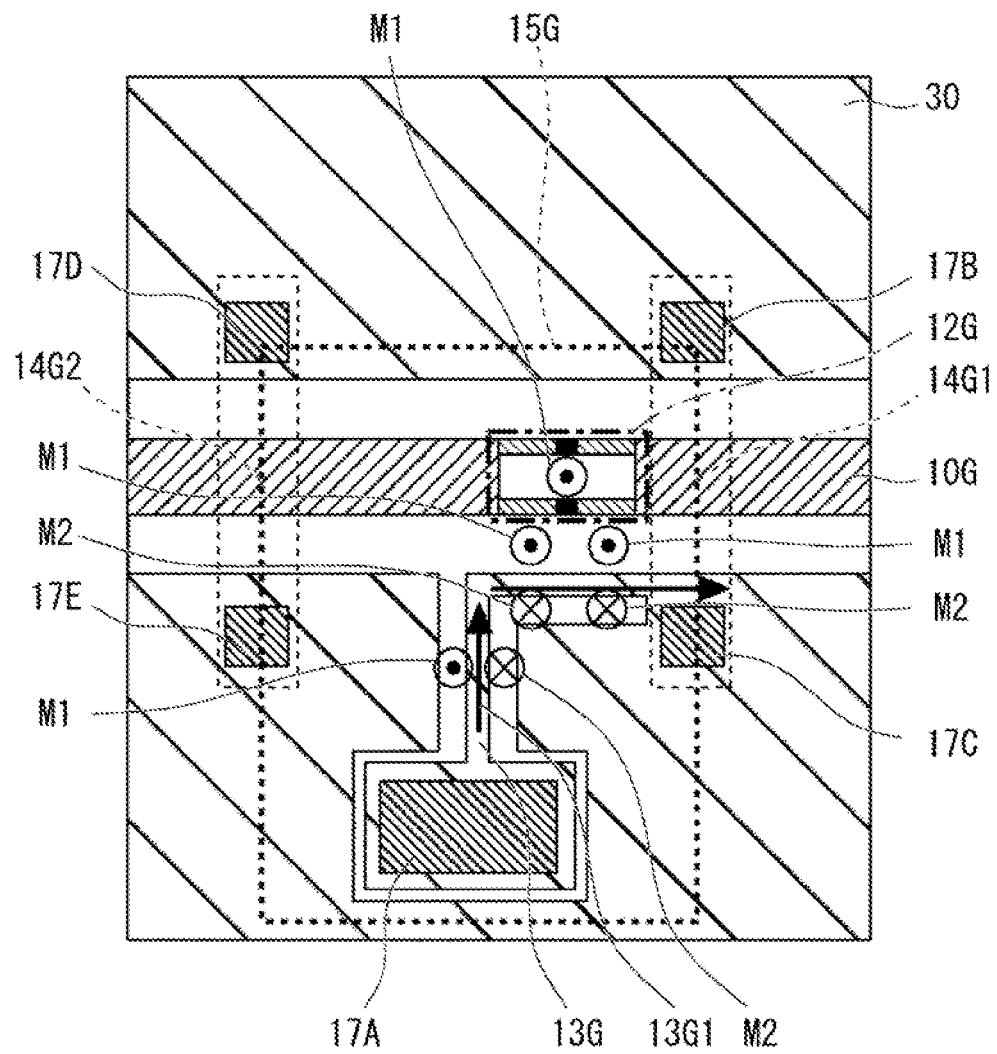
FIG. 23 is a diagram for explaining a configuration of a second modified example of the second example embodiment and a magnetic field around a SQUID 12G when a bias current flows.
Figure 24:
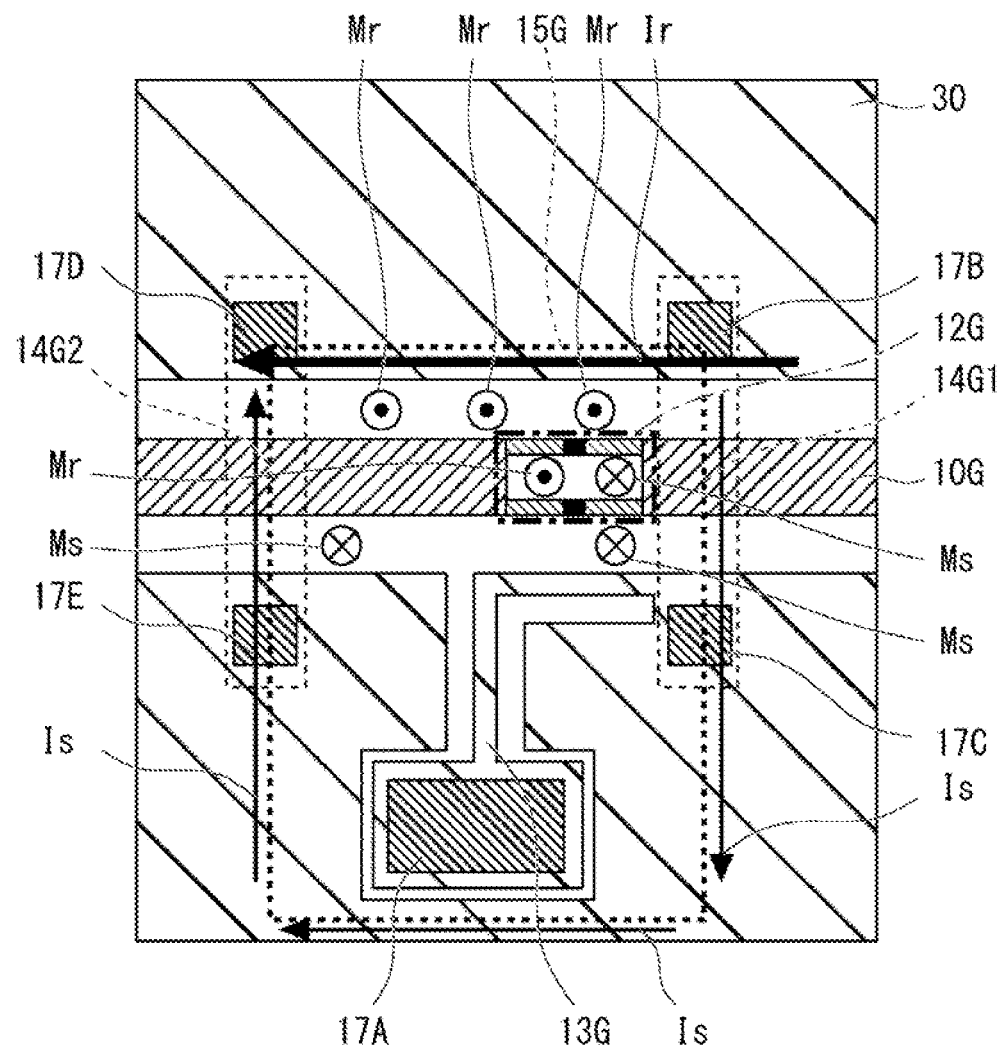
FIG. 24 is a diagram for explaining a magnetic field around the SQUID 12G when a return current flows in the second modified example of the second example embodiment.

FIG. 23 is a diagram for explaining a configuration according to a second modified example of the second example embodiment, and a magnetic field around a SQUID 12G when a bias current flows. FIG. 24 is a diagram for explaining a magnetic field around the SQUID 12G when a return current flows in the second modified example of the second example embodiment. Even in the example shown in FIG. 23, similarly to the example shown in FIG. 21, both ends of the SQUID 12G are electrically connected to the qubit 10G. Further, in the example shown in FIG. 23, the qubit 10G has multilevel wiring lines 14G1 and 14G2 which forms, in cooperation with the ground plane 30, the superconducting loop 15G. Further, the bias current 13G1 from the L-shaped bias line 13G is conducted, inside the superconducting loop 15G, only in one direction along one side of the superconducting loop 15G. Further, in the example shown in FIG. 23, a bias current 13G1 is supplied from the junction surface 17A of the interposer to the L-shaped bias line 13G. Further, junction surfaces 17B, 17C, 17D and 17E with the interposer are provided near the SQUID 12G. Therefore, a superconducting loop 15G surrounding the SQUID 12G is formed by the multilevel wiring line 14G1, which is an interposer electrically connecting the junction surfaces 17B and 17C, the multilevel wiring line 14G2 disposed inside the interposer electrically connecting the junction surfaces 17D and 17E, and the ground plane 30.

Note that, in the junction surfaces 17B and 17C, for example, the ground plane 30 of the superconducting circuit 1 is connected to the surface of the interposer on the side on which the superconducting circuit 1 is located by bumps or the like. Therefore, the ground planes 30 on both sides of the qubit 10G are electrically connected to each other through a connection part(s) (a superconducting member(s)) disposed in the surface of the interposer on the side on which the superconducting circuit 1 is located. Further, similarly, in the junction surfaces 17D and 17E, for example, the ground plane 30 of the superconducting circuit 1 is connected to the surface of the interposer on the side on which the superconducting circuit 1 is located by bumps or the like. Further, by the same principle (explanation) as that in the example shown in FIGS. 21, 22, etc., effects similar to those in the example shown in FIGS. 21, 22, etc. can be obtained even in the configuration shown in FIGS. 23 and 24.

Figure 25:
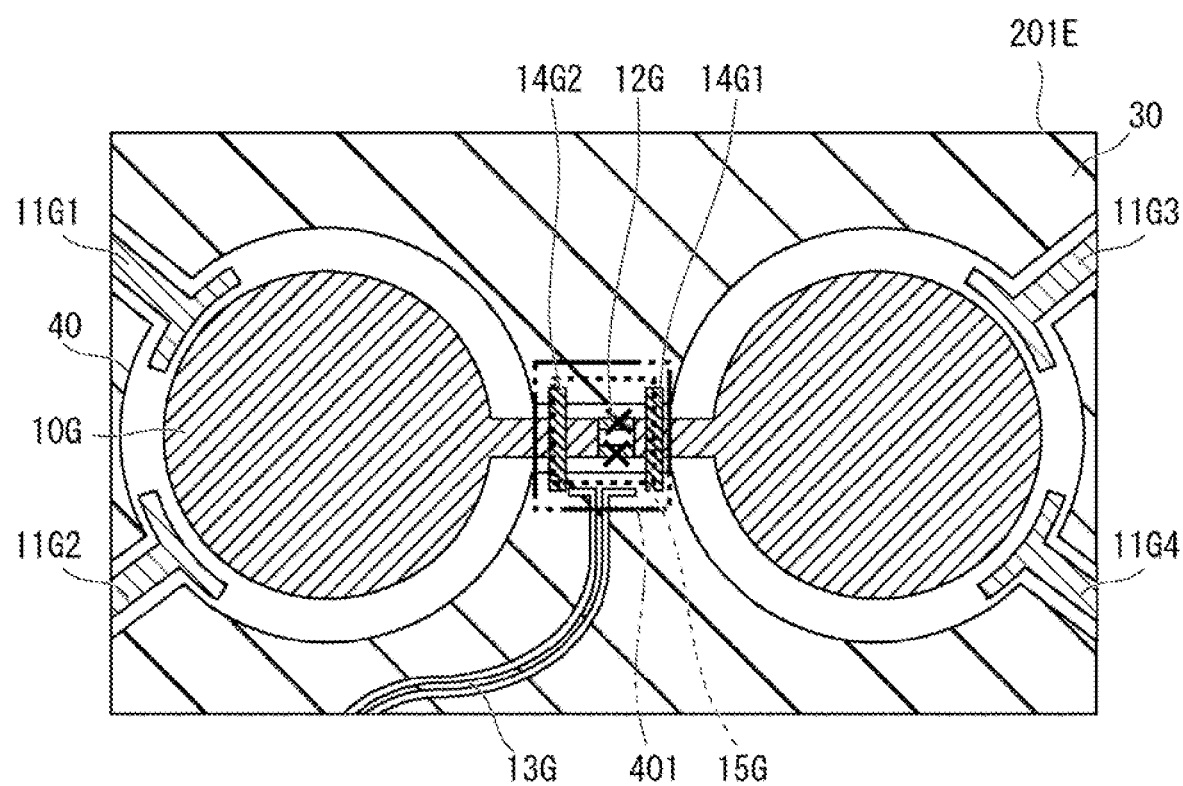
FIG. 25 shows an example of a configuration around a qubit 10G in a superconducting circuit 1 according to a third modified example of the second example embodiment.

Third Modified Example of Second Example Embodiment: Example in which Qubit 10 in which Two O-Shaped Parts are Connected by SQUID 12 is Used In FIGS. 19 to 24, examples in which a qubit 10 in which two L-shaped parts are connected to each other by a SQUID 12 is used have been described. An example in which a qubit 10 in which two O-shaped parts are connected to each other by a SQUID 12 will be described hereinafter with reference to FIG. 25. FIG. 25 shows an example of a configuration around a qubit 10G in a superconducting circuit 1 according to a third modified example of the second example embodiment. The inside of the area 201 shown in FIG. 1 may be configured as an area 201E shown in FIG. 25. In the example shown in FIG. 25, four coupling ports 11G1, 11G2, 11G3 and 11G4 are provided on the outer periphery of the O-shaped structure. Even in the example shown in FIG. 25, the inside of the area 401 may have any of the configurations shown in FIGS. 19 and 20, FIGS. 21 and 22, and FIGS. 23 and 24.

Third Example Embodiment: Example in which Qubit 10 in which SQUID 12 Whose One End is Connected to Ground is Connected Between Two L-Shaped Structures is Used In the second example embodiment, an example in which a qubit 10 is connected by a SQUID 12 which is not electrically connected to the ground plane 30 has been described. In a third example embodiment, as shown in FIG. 26, an example in which a qubit 10 in which a SQUID 12 whose one end is electrically connected to the ground plane 30 is connected between two L-shaped structures is used will be described.

Figure 26:
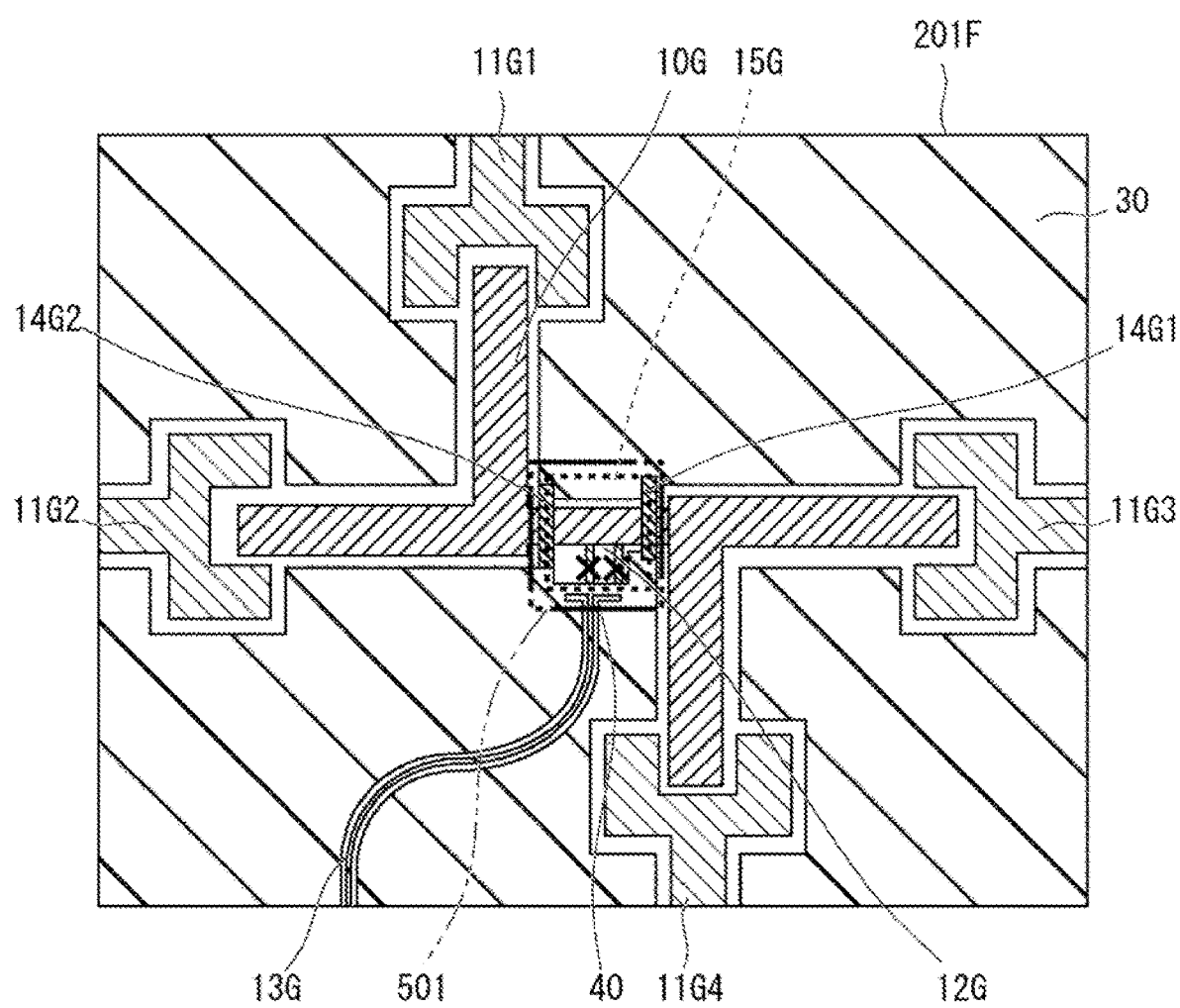
FIG. 26 shows an example of a configuration around a qubit 10G in a superconducting circuit 1 according to a third example embodiment.

FIG. 26 shows an example of a configuration around a qubit 10G in a superconducting circuit 1 according to the second example embodiment. The superconducting circuit 1 according to the third example embodiment has a configuration which is obtained by replacing the area 201 in FIG. 1 by an area 201F shown in FIG. 26. In the third example embodiment, since one end of the SQUID 12 is electrically connected to the ground plane 30, its equivalent circuit is identical to that in the first example embodiment. However, the left/right symmetry of the third example embodiment can be improved as compared with that in the first example embodiment.

Figure 27:
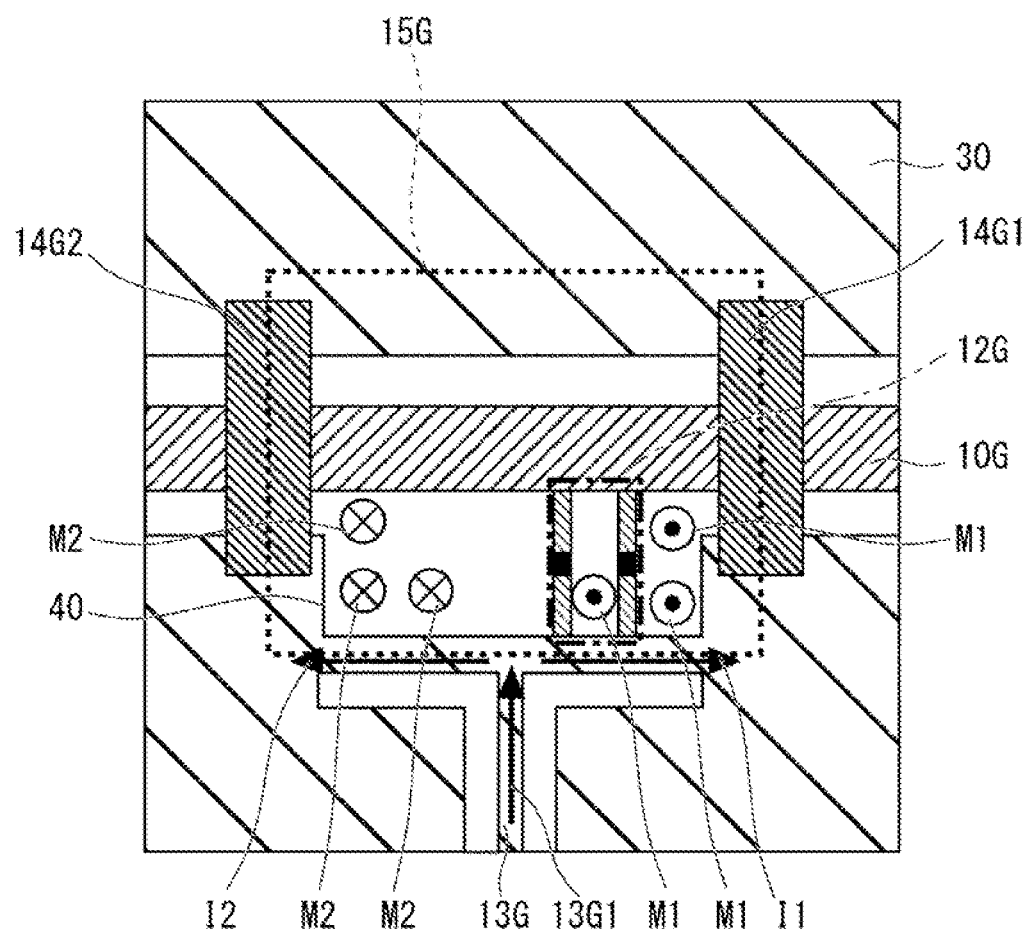
FIG. 27 is a diagram for explaining a configuration according to the third example embodiment and a magnetic field around a SQUID 12G when a bias current flows.
Figure 28:
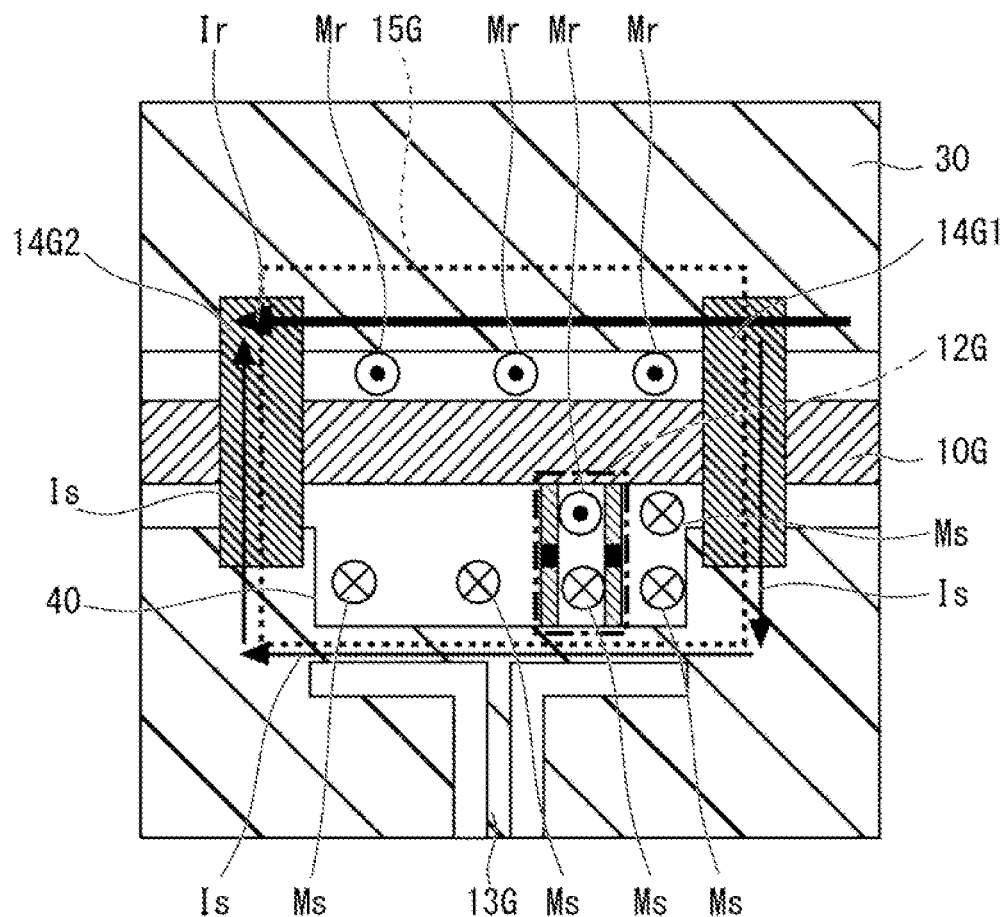
FIG. 28 is a diagram for explaining a magnetic field around the SQUID 12G when a return current flows in the third example embodiment.

FIG. 27 is a diagram for explaining a configuration according to the third example embodiment, and a magnetic field around a SQUID 12G when a bias current flows. FIG. 28 is a diagram for explaining a magnetic field around the SQUID 12G when a return current flows in the third example embodiment. Each of FIGS. 27 and 28 shows an example of an area 501 around the SQUID 12G shown in FIG. 26. In the example shown in FIG. 27, one end of the SQUID 12G is electrically connected to the qubit 10G and the other end thereof is connected to the ground plane 30. Further, in the example shown in FIG. 27, multilevel wiring lines 14G1 and 14G2, each of which is an air bridge that crosses over the qubit 10G, are provided, and a superconducting loop 15G surrounding the SQUID 12G is formed by the multilevel wiring lines 14G1 and 14G2, and the ground plane 30.

In the example shown in FIG. 27, similarly to the example shown in FIG. 3, the bias current 13G1 from the bias line 13G is divided into a branch current I1 which is conducted in a direction that is along one side of the superconducting loop and is approaching the SQUID 12G, and a branch current I2 which is conducted in a direction that is receding from the SQUID 12G. Since the branch currents I1 and I2 generate magnetic fluxes in directions opposite to each other in the superconducting loop 15G, the magnetic fluxes inside the superconducting loop 15G are maintained. Further, the part of the ground plane 30 through which the branch current I1 flows in the superconducting loop 15G is closer to the SQUID 12G than the part of the ground plane 30 through which the branch current I2 flows in the superconducting loop 15G is. The value of each of the branch currents is determined by the value of the bias current, so that it is possible to change the magnetic flux inside the SQUID 12G by changing the value of the bias current. Therefore, the resonance frequency of the qubit 10G is set by the bias current 13G1.

Further, as shown in FIG. 28, similarly to the example shown in FIG. 4, when a return current Ir caused by a bias current to a SQUID 12 (e.g., the SQUID 12A) other than the SQUID 12G flows to the ground plane 30, a magnetic flux Mr is generated inside the superconducting loop 15G by the return current Ir. Since the magnetic flux inside the area surrounded by the superconducting loop is conserved, a shielding current Is occurs in such a direction that a magnetic flux Ms whose direction is opposite to that of the magnetic flux Mr is generated. Further, the SQUID 12G is provided at a place where the value (strength) of the magnetic flux Mr is roughly equal to that of the magnetic flux Ms in the superconducting loop 15G. Therefore, the magnetic flux Mr is cancelled out by the magnetic flux Ms, so that the change of the magnetic flux inside the SQUID 12G caused by the return current Ir can be reduced. Therefore, the crosstalk, which would otherwise be caused by the bias current that is applied to apply a magnetic field to a SQUID 12 other than the SQUID 12G, can be appropriately reduced.

First Modified Example of Third Example Embodiment: Example in which Bias Line is Disposed so as to Extend in Direction Perpendicular to Multilevel Wiring Line In FIGS. 27 and 28, an example of a configuration in which a bias line is disposed so as to extend in a direction parallel to a multilevel wiring line has been described. An example in which a bias line is disposed so as to extend in a direction perpendicular to a multilevel wiring line will be described hereinafter with reference to FIGS. 29 and 30.

Figure 29:
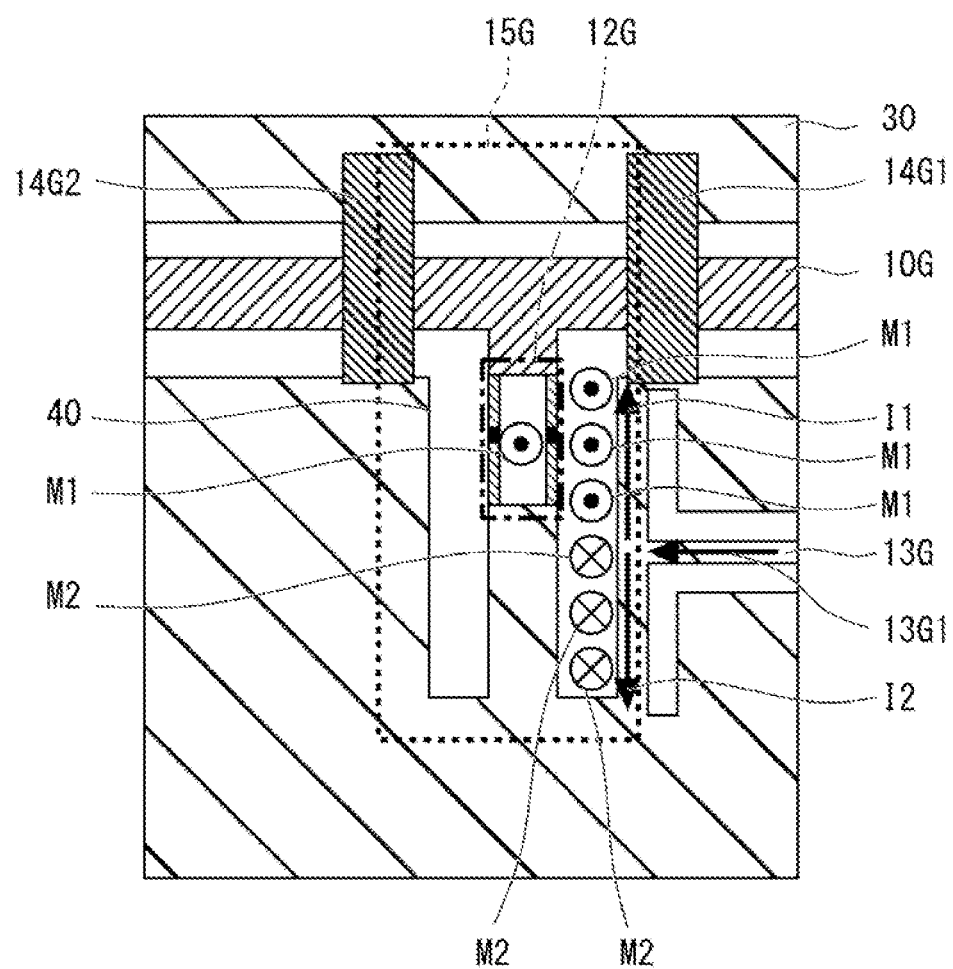
FIG. 29 is a diagram for explaining a configuration of a first modified example of the third example embodiment and a magnetic field around a SQUID 12G when a bias current flows.
Figure 30:
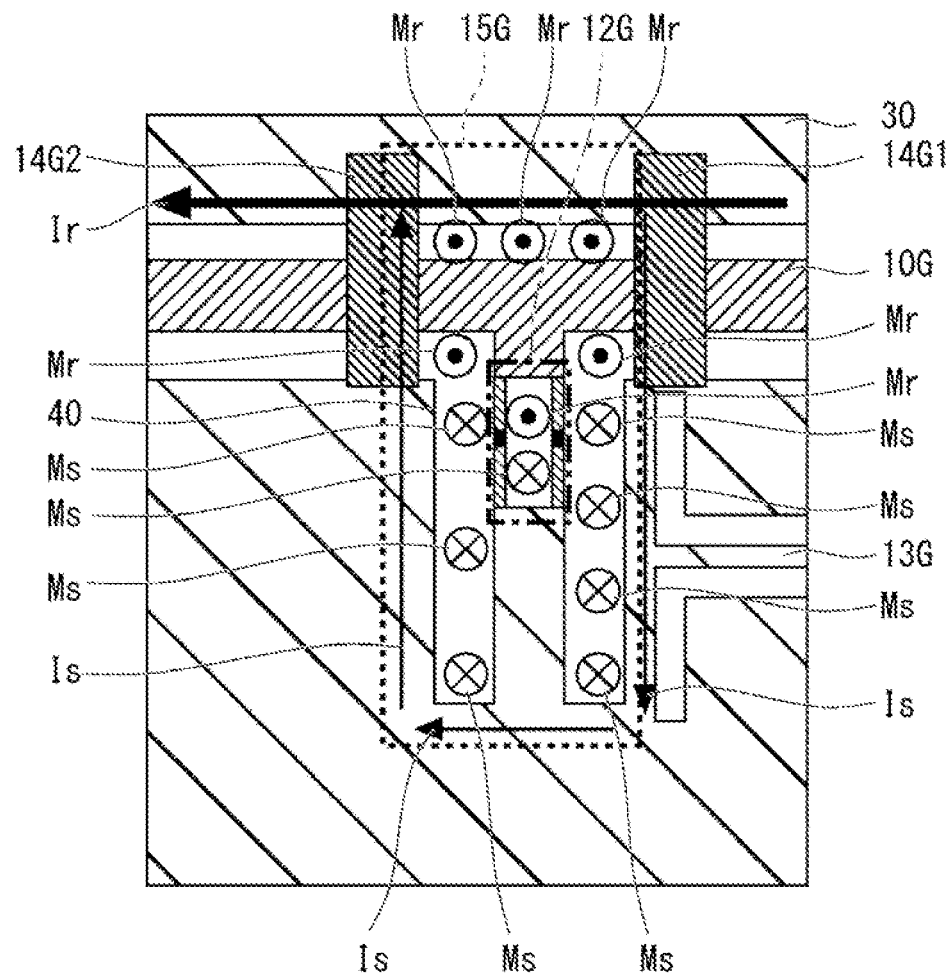
FIG. 30 is a diagram for explaining a magnetic field around the SQUID 12G when a return current flows in the first modified example of the third example embodiment.

FIG. 29 is a diagram for explaining a configuration according to a first modified example of the third example embodiment, and a magnetic field around a SQUID 12G when a bias current flows. FIG. 30 is a diagram for explaining a magnetic field around the SQUID 12G when a return current flows in the first modified example of the third example embodiment. In the example shown in FIG. 29, similarly to the example shown in FIG. 27, one end of the SQUID 12G is electrically connected to the qubit 10G and the other end thereof is connected to the ground plane 30. Further, in the example shown in FIG. 29, similarly to the example shown in FIG. 27, the bias current 13G1 from the bias line 13G is divided into a branch current I1 which is conducted in a direction that is along one side of the superconducting loop 15G and is approaching the SQUID 12G, and a branch current I2 which is conducted in a direction that is receding from the SQUID 12G. Further, by the same principle (explanation) as that in the example shown in FIGS. 27 and 28, effects similar to those in the example shown in FIGS. 27 and 28 can be obtained even when the bias line is disposed so as to extend in the direction perpendicular to the multilevel wiring line 14G as shown in FIGS. 29 and 30.

Second Modified Example of Third Example Embodiment: Example in which Bias Current is not Divided and Three Multilevel Wiring Lines are Used In FIGS. 27 to 30, examples of a configuration in which a superconducting loop 15G surrounding a SQUID 12G is formed by multilevel wiring lines 14G1 and 14G2, and a ground plane 30, and a bias current is divided have been described. An example of a configuration in which a superconducting loop 15G surrounding a SQUID 12G is formed by multilevel wiring lines 14G1, 14G2 and 14G3, and a ground plane 30, and a bias current is not divided will be described hereinafter with reference to FIGS. 31 and 32.

Figure 31:
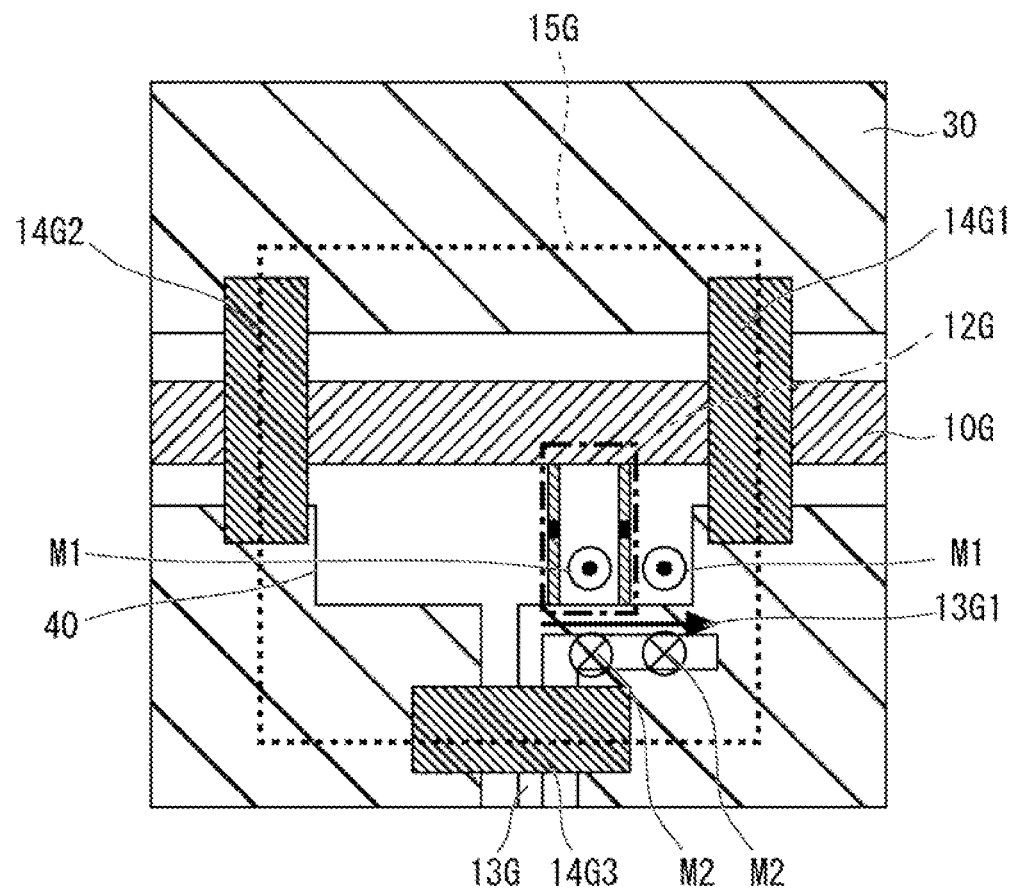
FIG. 31 is a diagram for explaining a configuration of a second modified example of the third example embodiment and a magnetic field around a SQUID 12G when a bias current flows.
Figure 32:
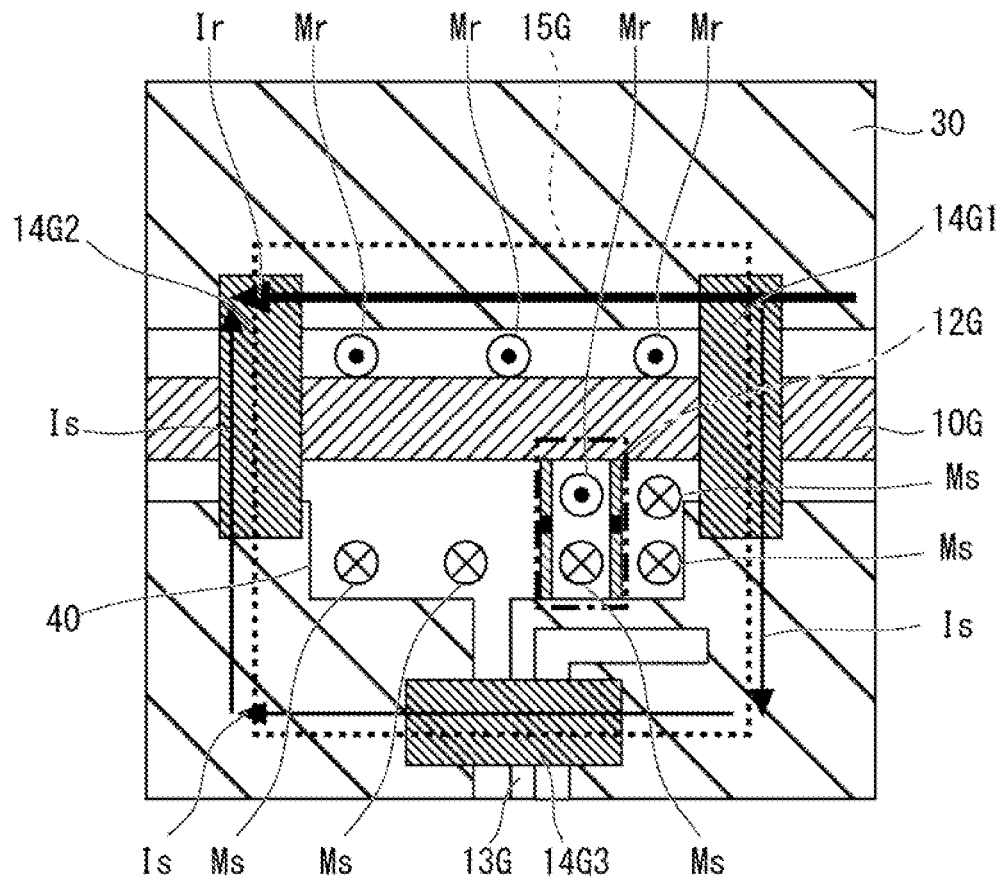
FIG. 32 is a diagram for explaining a magnetic field around the SQUID 12G when a return current flows in the second modified example of the third example embodiment.

FIG. 31 is a diagram for explaining a configuration according to a second modified example of the third example embodiment, and a magnetic field around a SQUID 12G when a bias current flows. FIG. 32 is a diagram for explaining a magnetic field around the SQUID 12G when a return current flows in the second modified example of the third example embodiment. FIGS. 31 and 32 show an example in which a bias line is disposed so as to extend in a direction parallel to multilevel wiring lines 14G1 and 14G2 each of which is an air bridge that crosses over the qubit 10G. In the example shown in FIG. 31, similarly to the example shown in FIG. 27, one end of the SQUID 12G is electrically connected to the qubit 10G and the other end thereof is connected to the ground plane 30. Further, in the example shown in FIG. 31, the bias current 13G1 from the L-shaped bias line 13G is conducted, inside the superconducting loop 15G, only in one direction along one side of the superconducting loop 15G. Further, by the same principle (explanation) as that in the example shown in FIGS. 7 and 8, similar effects can be obtained even in the third example embodiment.

Third Modified Example of Third Example Embodiment: Example in which Bias Current is not Divided and Plurality of Multilevel Wiring Lines are Used In FIGS. 31 and 32, an example in which a bias line is disposed so as to extend in a direction parallel to multilevel wiring lines 14G1 and 14G2 has been described. In contrast, in FIGS. 33 and 34, an example in which a bias line is disposed so as to extend in a direction perpendicular to multilevel wiring lines 14G1 and 14G2 will be described.

Figure 33:
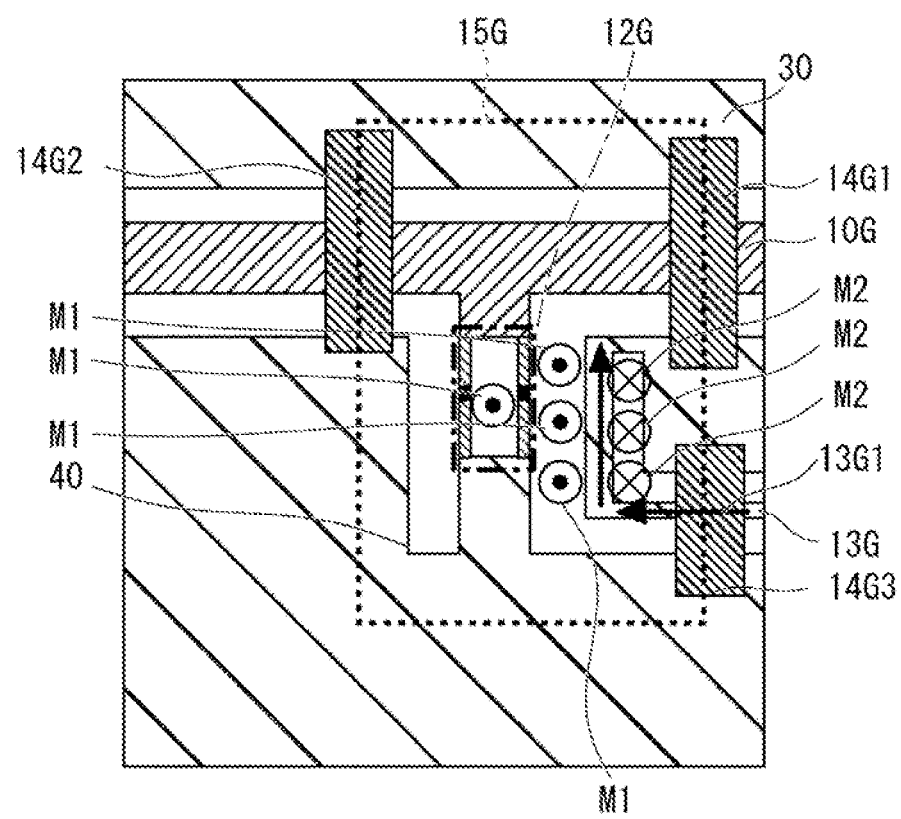
FIG. 33 is a diagram for explaining a configuration of a third modified example of the third example embodiment and a magnetic field around a SQUID 12G when a bias current flows.
Figure 34:
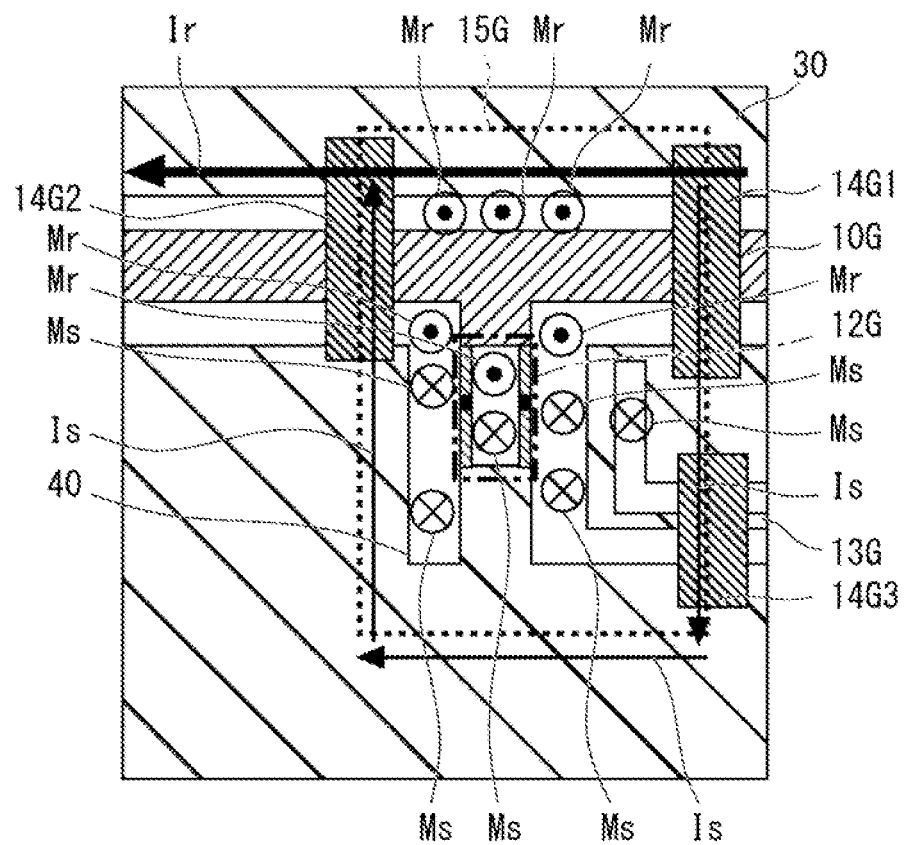
FIG. 34 is a diagram for explaining a magnetic field around the SQUID 12G when a return current flows in the third modified example of the third example embodiment.

FIG. 33 is a diagram for explaining a configuration according to a third modified example of the third example embodiment, and a magnetic field around a SQUID 12G when a bias current flows. FIG. 34 is a diagram for explaining a magnetic field around the SQUID 12G when a return current flows in the third modified example of the third example embodiment. In the example shown in FIG. 33, similarly to the example shown in FIG. 31, one end of the SQUID 12G is electrically connected to the qubit 10G and the other end thereof is connected to the ground plane 30. Further, in the example shown in FIG. 33, similarly to the example shown in FIG. 31, the bias current 13G1 from the L-shaped bias line 13G is conducted, inside the superconducting loop 15G, only in one direction along one side of the superconducting loop 15G. Further, by the same principle (explanation) as that in the example shown in FIGS. 31 and 32, similar effects can be obtained.

Figure 35:
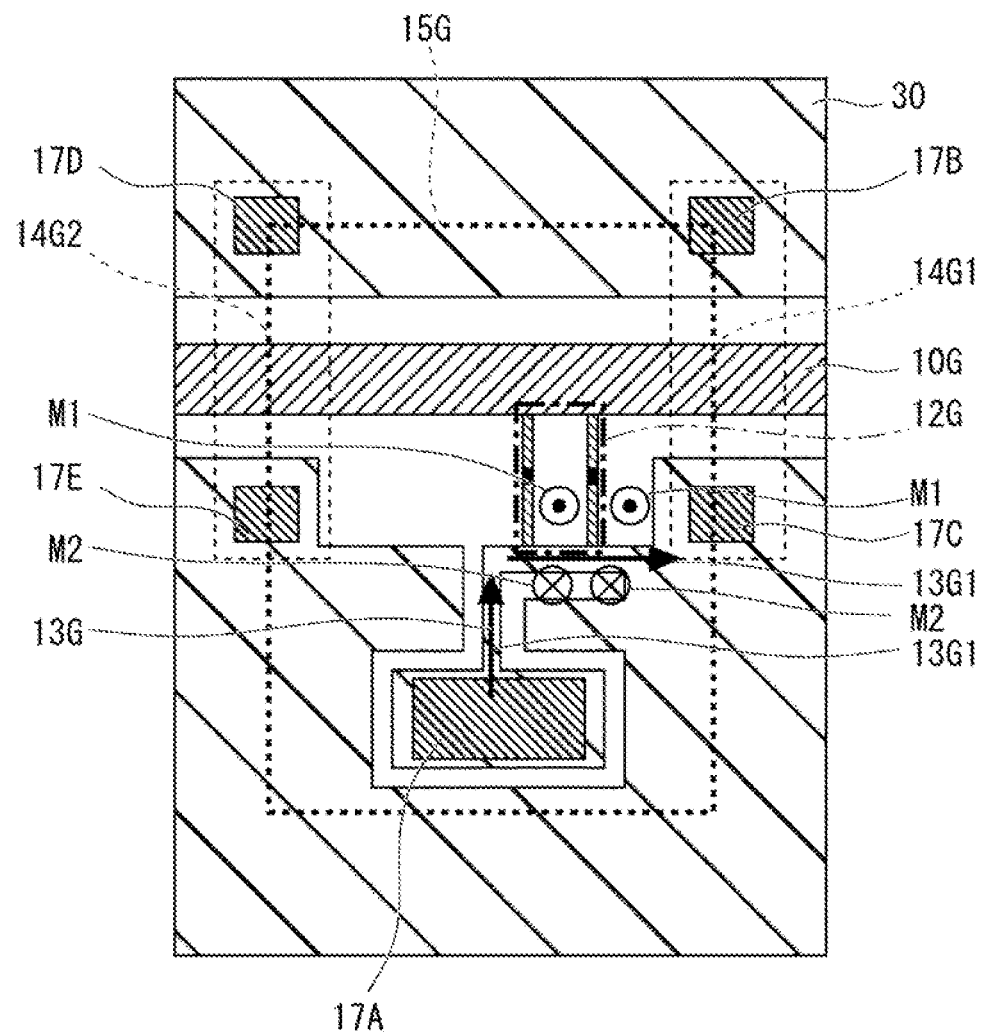
FIG. 35 is a diagram for explaining a configuration of a fourth modified example of the third example embodiment and a magnetic field around a SQUID 12G when a bias current flows.
Figure 36:
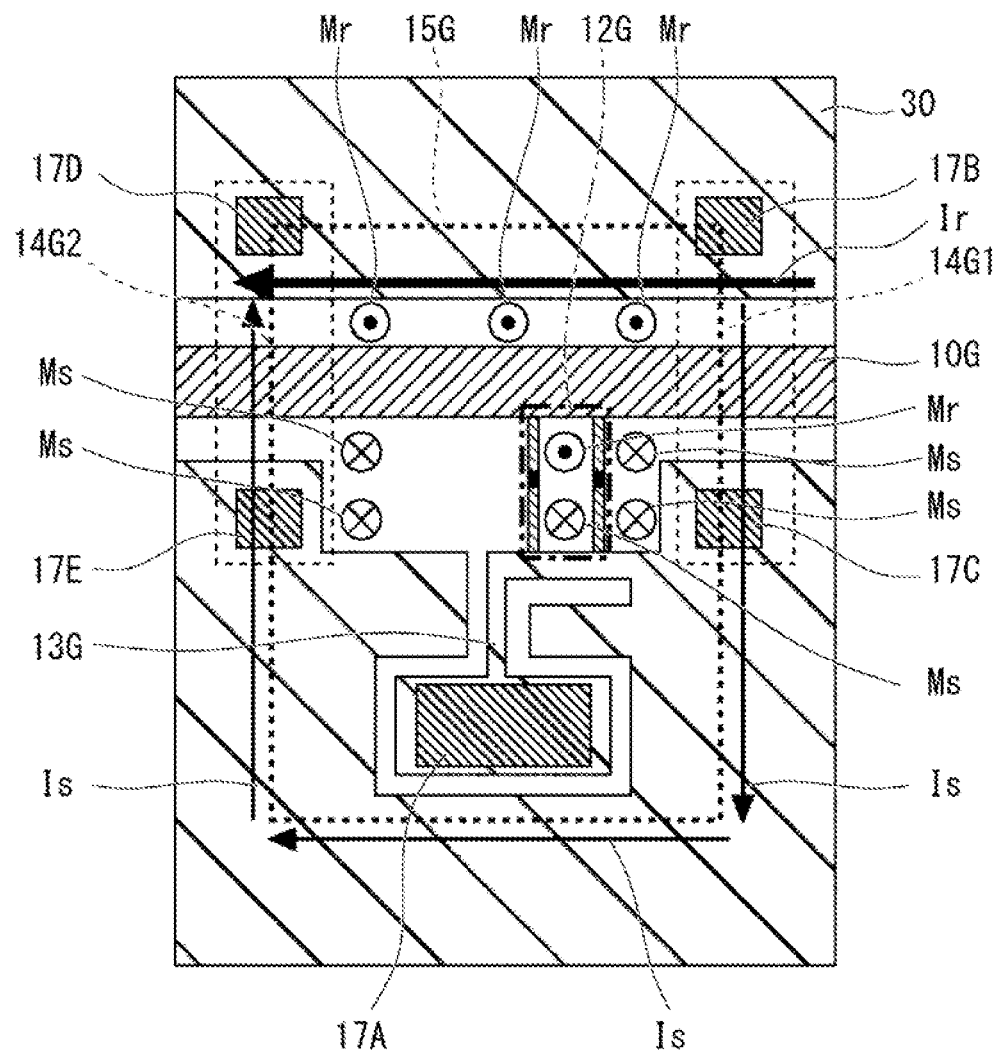
FIG. 36 is a diagram for explaining a magnetic field around the SQUID 12G when a return current flows in the fourth modified example of the third example embodiment.

Fourth Modified Example of Third Example Embodiment: Example in which Interposer is Used as Multilevel Wiring Line In FIGS. 27 to 34, examples in which an air bridge is used as a multilevel wiring line have been described. An example in which an interposer is used as a multilevel wiring line will be described hereinafter with reference to FIGS. 35 and 36. In FIGS. 35 and 36, an example in which a bias line is disposed so as to extend in a direction parallel to a multilevel wiring line is shown.

FIG. 35 is a diagram for explaining a configuration according to a fourth modified example of the third example embodiment, and a magnetic field around a SQUID 12G when a bias current flows. FIG. 36 is a diagram for explaining a magnetic field around the SQUID 12G when a return current flows in the fourth modified example of the third example embodiment. In the example shown in FIG. 33, similarly to the example shown in FIG. 31, one end of the SQUID 12G is electrically connected to the qubit 10G and the other end thereof is connected to the ground plane 30. Further, in the example shown in FIG. 35, similarly to the example shown in FIG. 31, the bias current 13G1 from the L-shaped bias line 13G is conducted, inside the superconducting loop 15G, only in one direction along one side of the superconducting loop 15G. Further, in the example shown in FIG. 35, a bias current 13G1 is supplied from the junction surface 17A of the interposer to the L-shaped bias line 13G. Further, junction surfaces 17B, 17C, 17D and 17E with the interposer are provided near the SQUID 12G. Therefore, a superconducting loop 15G surrounding the SQUID 12G is formed by the multilevel wiring line 14G1 disposed inside the interposer electrically connecting the junction surfaces 17B and 17C, the multilevel wiring line 14G2 disposed inside the interposer electrically connecting the junction surfaces 17D and 17E, and the ground plane 30. Further, by the same principle (explanation) as that in the example shown in FIGS. 31 and 32, similar effects can be obtained.

Fifth Modified Example of Third Example Embodiment: Example in which Interposer is Used as Multilevel Wiring Line (Another Example)

Figure 37:
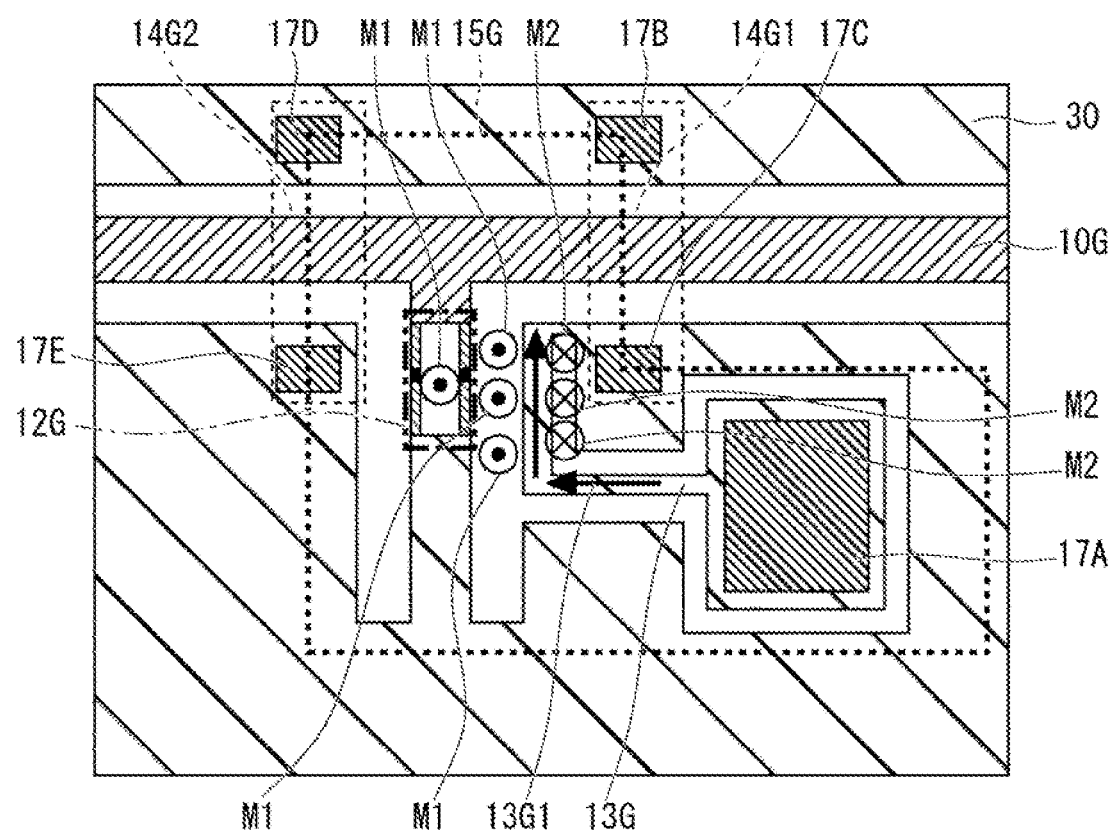
FIG. 37 is a diagram for explaining a configuration of a fifth modified example of the third example embodiment and a magnetic field around a SQUID 12G when a bias current flows.
Figure 38:
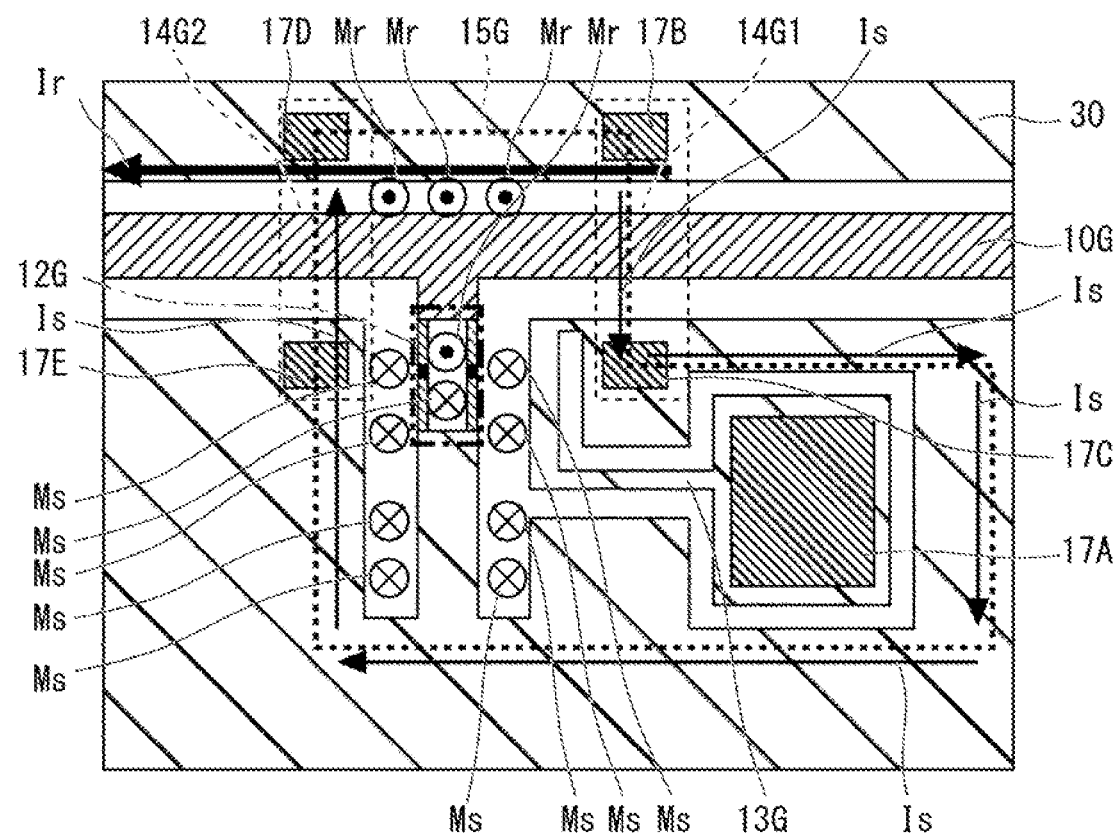
FIG. 38 is a diagram for explaining a magnetic field around the SQUID 12G when a return current flows in the fifth modified example of the third example embodiment.

In FIGS. 35 and 36, an example in which a bias line is disposed so as to extend in a direction parallel to a multilevel wiring line has been described. In FIGS. 37 and 38, an example in which a bias line is disposed so as to extend in a direction perpendicular to a multilevel wiring line will be described.

FIG. 37 is a diagram for explaining a configuration according to a fifth modified example of the third example embodiment, and a magnetic field around a SQUID 12G when a bias current flows. FIG. 38 is a diagram for explaining a magnetic field around the SQUID 12G when a return current flows in the fifth modified example of the third example embodiment. In the example shown in FIG. 37, similarly to the example shown in FIG. 35, one end of the SQUID 12G is electrically connected to the qubit 10G and the other end thereof is connected to the ground plane 30. In the example shown in FIG. 37, similarly to the example shown in FIG. 35, a bias current 13G1 is supplied from the junction surface 17A of the interposer to the L-shaped bias line 13G. Further, junction surfaces 17B, 17C, 17D and 17E with the interposer are provided near the SQUID 12G. Therefore, a superconducting loop 15G surrounding the SQUID 12G is formed by the multilevel wiring line 14G1 disposed inside the interposer electrically connecting the junction surfaces 17B and 17C, the multilevel wiring line 14G2 disposed inside the interposer electrically connecting the junction surfaces 17D and 17E, and the ground plane 30. Further, by the same principle (explanation) as that in the example shown in FIGS. 31 and 32, similar effects can be obtained.

Sixth Modified Example of Third Example Embodiment: Example in which Qubit 10 in which Two O-Shaped Parts are Connected by SQUID 12 Whose One End is Connected to Ground is Used In FIGS. 26 to 38, examples in which a qubit 10 in which two L-shaped parts are connected to each other by a SQUID 12 whose one end is connected to the ground is used have been described. An example in which a qubit 10 in which two O-shaped parts are connected to each other by a SQUID 12 whose one end is connected to the ground will be described hereinafter with reference to FIG. 39.

Figure 39:
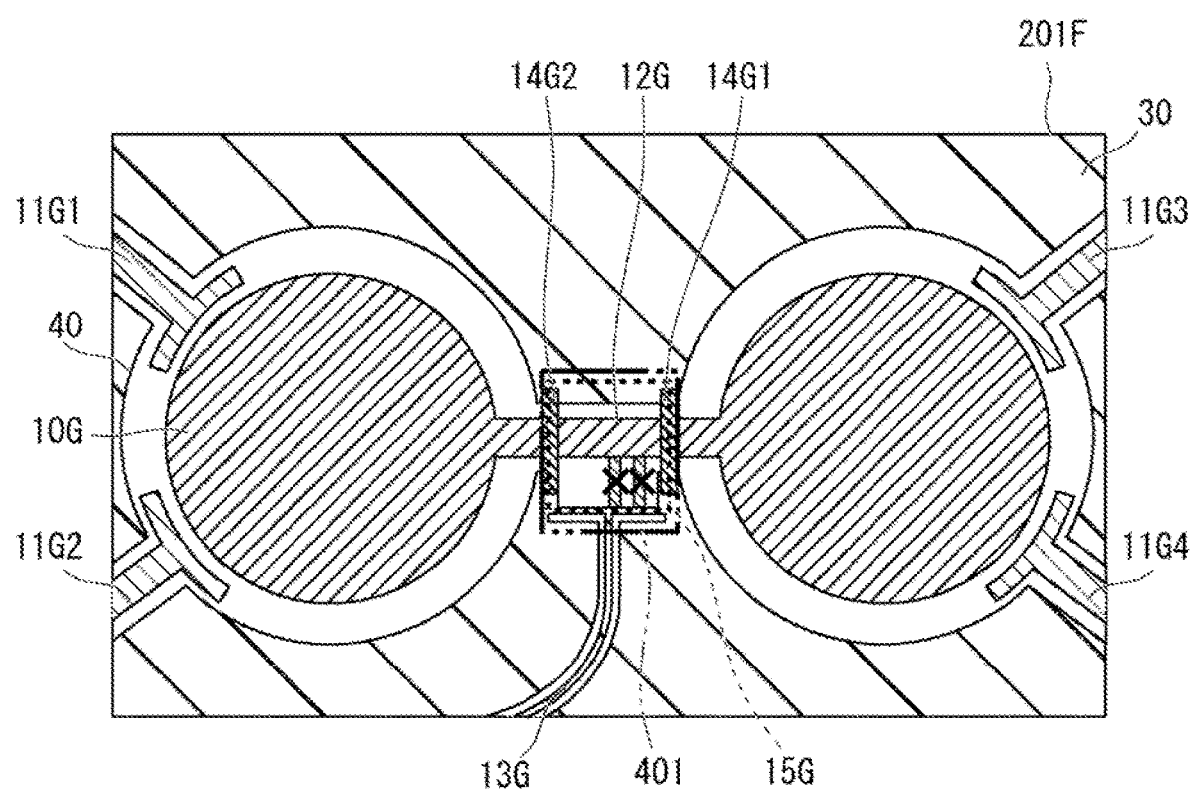
FIG. 39 shows an example of a configuration around a qubit 10G in a superconducting circuit 1 according to a sixth modified example of the third example embodiment.

FIG. 39 is a diagram showing an example of a configuration around a qubit 10G in a superconducting circuit 1 according to a sixth modified example of the third example embodiment. The inside of the area 201 shown in FIG. 1 may be configured as an area 201F shown in FIG. 39. In the example shown in FIG. 39, four coupling ports 11G1, 11G2, 11G3 and 11G4 are provided on the outer periphery of the O-shaped structure. Even in the example shown in FIG. 39, the inside of the area 401 may have any of the configurations shown in FIGS. 27 and 28, FIGS. 29 and 30, FIGS. 31 and 32, FIGS. 33 and 34, FIGS. 35 and 36, and FIGS. 37 and 38.

Effect of Present Disclosure

According to an aspect, the present disclosure provides a superconducting circuit 1 including: a qubit 10 including four coupling ports configured to enable the qubit 10 to interact with other four adjacent qubits; a SQUID 12 connected to the qubit 10 and configured to set a resonance frequency of the qubit 10 by a current from a bias line; and a multilevel wiring line, such as an air bridge, disposed at a place where the multilevel wiring line forms, in cooperation with a ground plane 30, a superconducting loop surrounding the SQUID 12. Therefore, crosstalk can be appropriately reduced.

Note that the present invention is not limited to the above-described example embodiments, and they may be modified as appropriate without departing from the scope and spirit of the invention.

The first, second, and third example embodiments can be combined as desirable by one of ordinary skill in the art.

While the disclosure has been particularly shown and described with reference to example embodiments thereof, the disclosure is not limited to these example embodiments. It will be understood by those of ordinary skill in the art that various changes in form and details may be made therein without departing from the spirit and scope of the present disclosure as defined by the claims.

The whole or part of the example embodiments disclosed above can be described as, but not limited to, the following supplementary notes.

(Supplementary Note 1)

A superconducting circuit comprising:

a ground plane comprising a superconducting member;

a plurality of superconducting parts surrounded by a non-conductive part so as to be spaced from the ground plane, each of the plurality of superconducting parts including four coupling ports each configured to enable the superconducting part to interact with another superconducting part;

a superconducting quantum interference device configured to set a resonance frequency of a first superconducting part included in the plurality of superconducting parts; and a multilevel wiring line configured to form, in cooperation with the ground plane, a superconducting loop surrounding the superconducting quantum interference device, wherein the superconducting quantum interference device is disposed, in an area inside the superconducting loop, at a place where a magnetic field generated by a current from a bias line for the first superconducting part is applied.

(Supplementary Note 2)

The superconducting circuit described in Supplementary note 1, wherein the multilevel wiring line comprises at least one of an air bridge and an interposer.

(Supplementary Note 3)

The superconducting circuit described in Supplementary note 1 or 2, wherein a first end of the superconducting quantum interference device is connected to the first superconducting part, and a second end thereof is connected to the ground plane, the multilevel wiring line is disposed at a place where the multilevel wiring line crosses over the first superconducting part, and a current from the bias line to the superconducting quantum interference device is conducted in two directions different from each other along one side of a superconducting loop surrounding the superconducting quantum interference device.

(Supplementary Note 4)

The superconducting circuit described in any one of Supplementary notes 1 to 3, wherein a first end of the superconducting quantum interference device is connected to the first superconducting part, and a second end thereof is connected to the ground plane, the multilevel wiring line comprises a first multilevel wiring line that crosses over the first superconducting part and a second multilevel wiring line that crosses over the bias line, and a current from the bias line to the superconducting quantum interference device is conducted only in one direction along one side of the superconducting loop.

(Supplementary Note 5)

The superconducting circuit described in any one of Supplementary notes 1 to 4, wherein a first part and a second part of the first superconducting part are separated from each other by the superconducting quantum interference device, a first end of the superconducting quantum interference device is connected to the first part, and a second end thereof is connected to the second part, the superconducting circuit further comprises a plurality of multilevel wiring lines configured to form, in cooperation with the ground plane, a superconducting loop surrounding the superconducting quantum interference device, and a current from the bias line to the superconducting quantum interference device is conducted in two directions different from each other along one side of the superconducting loop.

(Supplementary Note 6)

The superconducting circuit described in any one of Supplementary notes 1 to 5, wherein a first part and a second part of the first superconducting part are separated from each other by the superconducting quantum interference device, a first end of the superconducting quantum interference device is connected to the first part, and a second end thereof is connected to the second part, the superconducting circuit further comprises a plurality of multilevel wiring lines configured to form, in cooperation with the ground plane, a superconducting loop surrounding the superconducting quantum interference device, and a current from the bias line to the superconducting quantum interference device is conducted only in one direction along one side of the superconducting loop.

(Supplementary Note 7)

The superconducting circuit described in any one of Supplementary notes 1 to 6, wherein a first end of the superconducting quantum interference device is connected to the first superconducting part, and a second end thereof is connected to the ground plane, the multilevel wiring line comprises a first multilevel wiring line and a second multilevel wiring line each of which crosses over the first superconducting part, and a current from the bias line to the superconducting quantum interference device is conducted in two directions different from each other along one side of the superconducting loop.

(Supplementary Note 8)

The superconducting circuit described in any one of Supplementary notes 1 to 7, wherein a first end of the superconducting quantum interference device is connected to the first superconducting part, and a second end thereof is connected to the ground plane, the multilevel wiring line comprises a first multilevel wiring line and a second multilevel wiring line each of which crosses over the first superconducting part, and a current from the bias line to the superconducting quantum interference device is conducted only in one direction along one side of the superconducting loop.

What is claimed is:

1. A superconducting circuit comprising:
a ground plane comprising a superconducting member;
a plurality of superconducting parts surrounded by a non-conductive part so as to be spaced from the ground plane, each of the plurality of superconducting parts including four coupling ports each configured to enable the superconducting part to interact with another superconducting part;
a superconducting quantum interference device configured to set a resonance frequency of a first superconducting part included in the plurality of superconducting parts; and
a multilevel wiring line configured to form, in cooperation with the ground plane, a superconducting loop surrounding the superconducting quantum interference device, wherein
the superconducting quantum interference device is disposed, in an area inside the superconducting loop, at a place where a magnetic field generated by a current from a bias line for the first superconducting part is applied.

2. The superconducting circuit according to claim 1, wherein the multilevel wiring line comprises at least one of an air bridge and an interposer.

3. The superconducting circuit according to claim 2, wherein
a first end of the superconducting quantum interference device is connected to the first superconducting part, and a second end thereof is connected to the ground plane,
the multilevel wiring line is disposed at a place where the multilevel wiring line crosses over the first superconducting part, and
a current from the bias line to the superconducting quantum interference device is conducted in two directions different from each other along one side of a superconducting loop surrounding the superconducting quantum interference device.

4. The superconducting circuit according to claim 2, wherein
a first end of the superconducting quantum interference device is connected to the first superconducting part, and a second end thereof is connected to the ground plane,
the multilevel wiring line comprises a first multilevel wiring line that crosses over the first superconducting part and a second multilevel wiring line that crosses over the bias line, and
a current from the bias line to the superconducting quantum interference device is conducted only in one direction along one side of the superconducting loop.

5. The superconducting circuit according to claim 2, wherein
a first part and a second part of the first superconducting part are separated from each other by the superconducting quantum interference device,
a first end of the superconducting quantum interference device is connected to the first part, and a second end thereof is connected to the second part,
the superconducting circuit further comprises a plurality of multilevel wiring lines configured to form, in cooperation with the ground plane, a superconducting loop surrounding the superconducting quantum interference device, and
a current from the bias line to the superconducting quantum interference device is conducted in two directions different from each other along one side of the superconducting loop.

6. The superconducting circuit according to claim 2, wherein
a first part and a second part of the first superconducting part are separated from each other by the superconducting quantum interference device,
a first end of the superconducting quantum interference device is connected to the first part, and a second end thereof is connected to the second part,
the superconducting circuit further comprises a plurality of multilevel wiring lines configured to form, in cooperation with the ground plane, a superconducting loop surrounding the superconducting quantum interference device, and
a current from the bias line to the superconducting quantum interference device is conducted only in one direction along one side of the superconducting loop.

7. The superconducting circuit according to claim 2, wherein
a first end of the superconducting quantum interference device is connected to the first superconducting part, and a second end thereof is connected to the ground plane,
the multilevel wiring line comprises a first multilevel wiring line and a second multilevel wiring line each of which crosses over the first superconducting part, and
a current from the bias line to the superconducting quantum interference device is conducted in two directions different from each other along one side of the superconducting loop.

8. The superconducting circuit according to claim 2, wherein
a first end of the superconducting quantum interference device is connected to the first superconducting part, and a second end thereof is connected to the ground plane,
the multilevel wiring line comprises a first multilevel wiring line and a second multilevel wiring line each of which crosses over the first superconducting part, and
a current from the bias line to the superconducting quantum interference device is conducted only in one direction along one side of the superconducting loop.

9. The superconducting circuit according to claim 1, wherein
a first end of the superconducting quantum interference device is connected to the first superconducting part, and a second end thereof is connected to the ground plane,
the multilevel wiring line is disposed at a place where the multilevel wiring line crosses over the first superconducting part, and a current from the bias line to the superconducting quantum interference device is conducted in two directions different from each other along one side of a superconducting loop surrounding the superconducting quantum interference device.

10. The superconducting circuit according to claim 1, wherein
a first end of the superconducting quantum interference device is connected to the first superconducting part, and a second end thereof is connected to the ground plane,
the multilevel wiring line comprises a first multilevel wiring line that crosses over the first superconducting part and a second multilevel wiring line that crosses over the bias line, and
a current from the bias line to the superconducting quantum interference device is conducted only in one direction along one side of the superconducting loop.

11. The superconducting circuit according to claim 1, wherein
a first part and a second part of the first superconducting part are separated from each other by the superconducting quantum interference device,
a first end of the superconducting quantum interference device is connected to the first part, and a second end thereof is connected to the second part,
the superconducting circuit further comprises a plurality of multilevel wiring lines configured to form, in cooperation with the ground plane, a superconducting loop surrounding the superconducting quantum interference device, and
a current from the bias line to the superconducting quantum interference device is conducted in two directions different from each other along one side of the superconducting loop.

12. The superconducting circuit according to claim 1, wherein
a first part and a second part of the first superconducting part are separated from each other by the superconducting quantum interference device,
a first end of the superconducting quantum interference device is connected to the first part, and a second end thereof is connected to the second part,
the superconducting circuit further comprises a plurality of multilevel wiring lines configured to form, in cooperation with the ground plane, a superconducting loop surrounding the superconducting quantum interference device, and
a current from the bias line to the superconducting quantum interference device is conducted only in one direction along one side of the superconducting loop.

13. The superconducting circuit according to claim 1, wherein
a first end of the superconducting quantum interference device is connected to the first superconducting part, and a second end thereof is connected to the ground plane,
the multilevel wiring line comprises a first multilevel wiring line and a second multilevel wiring line each of which crosses over the first superconducting part, and
a current from the bias line to the superconducting quantum interference device is conducted in two directions different from each other along one side of the superconducting loop.

14. The superconducting circuit according to claim 1, wherein
a first end of the superconducting quantum interference device is connected to the first superconducting part, and a second end thereof is connected to the ground plane,
the multilevel wiring line comprises a first multilevel wiring line and a second multilevel wiring line each of which crosses over the first superconducting part, and
a current from the bias line to the superconducting quantum interference device is conducted only in one direction along one side of the superconducting loop.

\* \* \* \* \*